(12) United States Patent
Rie et al.

(10) Patent No.: US 11,972,831 B2
(45) Date of Patent: Apr. 30, 2024

(54) RECEIVER FOR RECEIVING MULTI-LEVEL SIGNAL AND MEMORY DEVICE INCLUDING THE SAME

(71) Applicant: SAMSUNG ELECTRONICS CO., LTD., Suwon-si (KR)

(72) Inventors: Hyunsub Rie, Yongin-si (KR); Eunseok Shin, Seoul (KR); Youngdon Choi, Seoul (KR); Changsoo Yoon, Seoul (KR); Hyunyoon Cho, Uiwang-si (KR); Junghwan Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 161 days.

(21) Appl. No.: 17/827,126

(22) Filed: May 27, 2022

(65) Prior Publication Data
US 2023/0120821 A1    Apr. 20, 2023

(30) Foreign Application Priority Data

Oct. 20, 2021    (KR) .................. 10-2021-0140203

(51) Int. Cl.
| | | |
|---|---|---|
| G11C 7/06 | (2006.01) | |
| G11C 7/10 | (2006.01) | |
| G11C 7/14 | (2006.01) | |

(52) U.S. Cl.
CPC ............ *G11C 7/062* (2013.01); *G11C 7/1012* (2013.01); *G11C 7/1039* (2013.01);
(Continued)

(58) Field of Classification Search
CPC ..... G11C 7/062; G11C 7/1012; G11C 7/1039; G11C 7/1063; G11C 7/109; G11C 7/14;
(Continued)

(56) References Cited

U.S. PATENT DOCUMENTS

| | | | | |
|---|---|---|---|---|
| 3,988,676 A | * | 10/1976 | Whang | ............... H04L 25/4919 |
| | | | | 375/257 |
| 4,654,827 A | * | 3/1987 | Childers | ................ G11C 29/34 |
| | | | | 365/201 |

(Continued)

FOREIGN PATENT DOCUMENTS

| | | | | |
|---|---|---|---|---|
| CN | 116628776 A | * | 8/2023 | ........... G06F 3/0622 |
| KR | 10-0897280 | | 5/2009 | |

OTHER PUBLICATIONS

Mostafa Rashdan et al., "Differential-Time and Pulse-Amplitude-Modulation Signaling for Serial Link Transceivers", 2014 IEEE 44th International Symposium on Multiple-Valued Logic.
(Continued)

*Primary Examiner* — Michael T Tran
(74) *Attorney, Agent, or Firm* — F. Chau & Associates, LLC

(57) ABSTRACT

A receiver that receives a multi-level signal includes a pre-amplifier circuit, a slicer circuit and a decoder circuit. The pre-amplifier circuit generates a plurality of intermediate data signals based on an input data signal and a plurality of reference voltages. The slicer circuit generates a plurality of decision signals based on the plurality of intermediate data signals and a clock signal. The decoder circuit generates output data based on the plurality of decision signals. The pre-amplifier circuit includes a first circuit and a second circuit. The first circuit generates one of the plurality of intermediate data signals based on the input data signal and one of the plurality of reference voltages, and has a first structure. The second circuit generates another one of the plurality of intermediate data signals based on the input data signal and another one of the plurality of reference voltages, and has a second structure different from the first structure.

20 Claims, 29 Drawing Sheets

(52) U.S. Cl.
CPC ............ *G11C 7/1063* (2013.01); *G11C 7/109* (2013.01); *G11C 7/14* (2013.01)

(58) Field of Classification Search
CPC ..... G11C 5/063; G11C 7/1084; G11C 7/1096; G11C 7/1078; H03K 7/02; H04L 25/4917; H04L 25/0292
USPC .................................................. 365/205, 207
See application file for complete search history.

(56) References Cited

U.S. PATENT DOCUMENTS

| | | | |
|---|---|---|---|
| 5,623,300 A * | 4/1997 | Itoh .................... | H04N 1/40031 347/240 |
| 6,396,329 B1 * | 5/2002 | Zerbe ................... | G11C 7/1084 327/333 |
| 6,763,060 B1 * | 7/2004 | Knapp ................. | H04B 1/1615 375/376 |
| 7,099,400 B2 | 8/2006 | Yang et al. | |
| 7,167,527 B1 * | 1/2007 | Park .................... | H04L 25/4923 375/295 |
| 7,327,184 B2 | 2/2008 | Sung et al. | |
| 7,626,442 B2 | 12/2009 | Zerbe et al. | |
| 7,733,727 B2 | 6/2010 | Hwang et al. | |
| 8,045,647 B2 | 10/2011 | Oh et al. | |
| 8,750,406 B2 | 6/2014 | Pan et al. | |
| 9,094,238 B2 | 7/2015 | Zerbe et al. | |
| 9,544,169 B2 | 1/2017 | Zerbe et al. | |
| 11,132,176 B2 * | 9/2021 | Hung .................... | G11C 16/24 |
| 2003/0222720 A1 * | 12/2003 | Sumita ................. | H03L 7/0891 331/16 |
| 2005/0078712 A1 * | 4/2005 | Voutilainen ......... | H04L 25/4917 370/535 |
| 2005/0179487 A1 * | 8/2005 | Lee ........................ | H03M 3/49 330/10 |
| 2007/0030066 A1 * | 2/2007 | Sohn ................... | H03F 3/45183 330/253 |
| 2007/0200619 A1 * | 8/2007 | Jang .................... | H03F 3/45179 330/9 |
| 2007/0226597 A1 * | 9/2007 | Taito ................... | G06F 11/1068 714/E11.038 |
| 2007/0237016 A1 * | 10/2007 | Miyamoto ............... | G11C 11/22 365/222 |
| 2008/0291073 A1 * | 11/2008 | Iwata .................. | H03M 1/0609 341/159 |
| 2009/0080269 A1 * | 3/2009 | Nishikawa ........... | G11C 7/1051 365/189.15 |
| 2012/0182043 A1 * | 7/2012 | Dang ................. | H04L 25/03834 326/21 |
| 2012/0268995 A1 * | 10/2012 | Sugimoto ............ | G11C 16/349 365/185.11 |
| 2014/0105265 A1 * | 4/2014 | Ho ...................... | H04L 41/0806 375/224 |
| 2016/0191276 A1 * | 6/2016 | Sakai ................ | H04L 25/03057 375/233 |
| 2019/0089466 A1 * | 3/2019 | Li ....................... | H04B 10/5161 |
| 2020/0065267 A1 | 2/2020 | Mayer et al. | |
| 2021/0090675 A1 * | 3/2021 | M. .......................... | G11C 7/22 |
| 2021/0376847 A1 * | 12/2021 | Zhang ................... | H03M 1/124 |
| 2022/0149864 A1 * | 5/2022 | Prakash ................ | H03M 3/458 |

OTHER PUBLICATIONS

EESR dated Jul. 11, 2022 in corresponding Application No. EP 22176395.6.

* cited by examiner

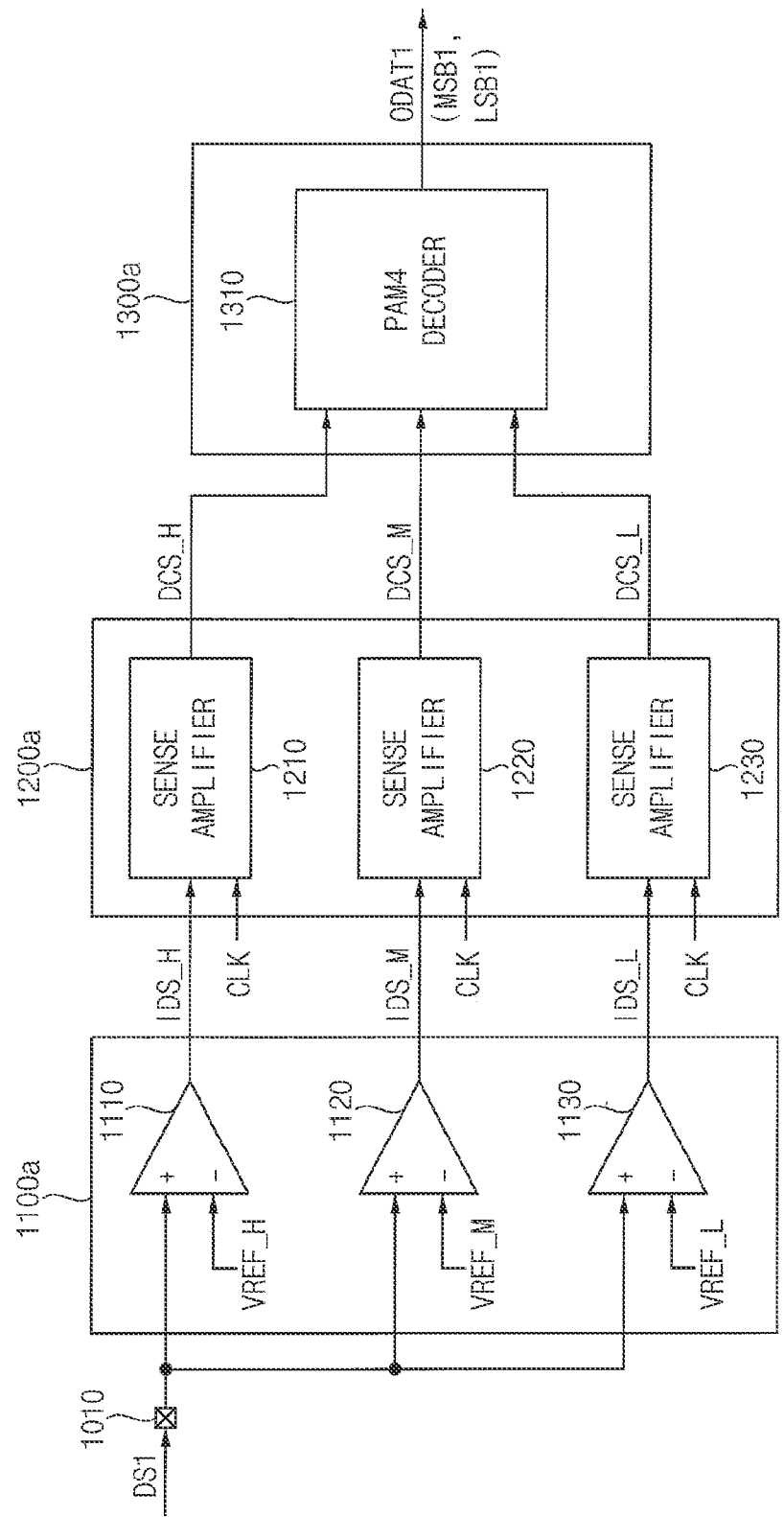

FIG. 4
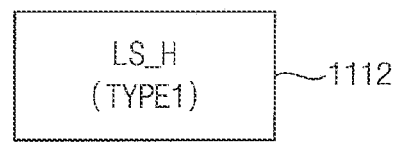
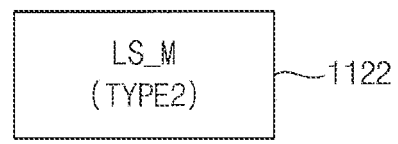
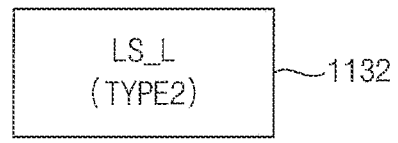
FIG. 5
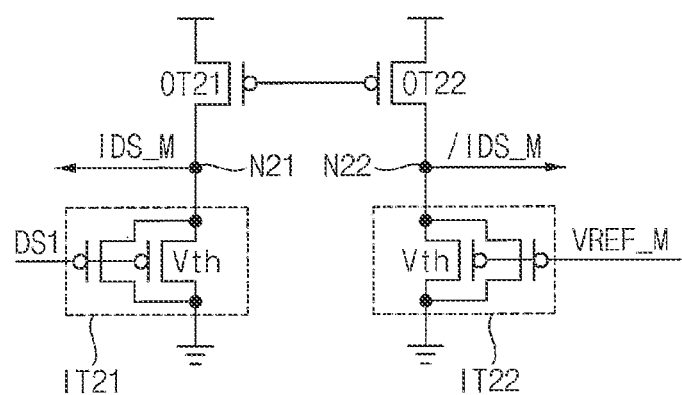

FIG. 8
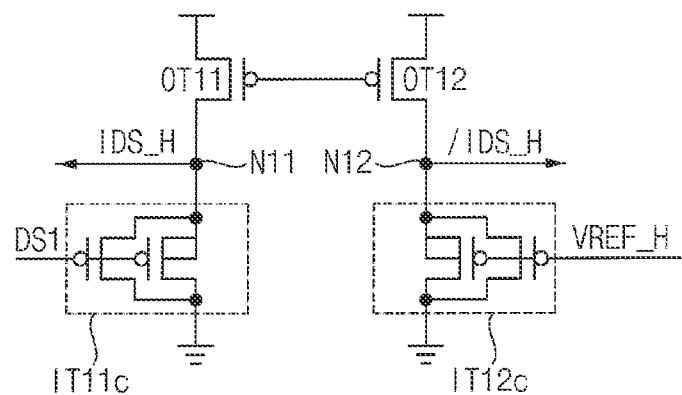
FIG. 9
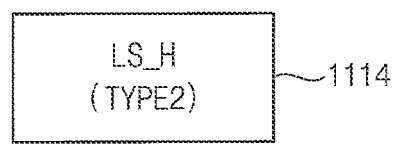
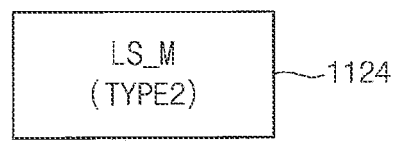
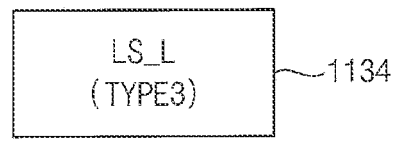

RECEIVER FOR RECEIVING MULTI-LEVEL SIGNAL AND MEMORY DEVICE INCLUDING THE SAME

CROSS-REFERENCE TO RELATED APPLICATION

This U.S. non-provisional patent application claims priority under 35 USC § 119 to Korean Patent Application No. 10-2021-0140203 filed on Oct. 20, 2021 in the Korean Intellectual Property Office (KIPO), the disclosure of which is incorporated by reference in its entirety herein.

1. Technical Field

Example embodiments relate generally to semiconductor integrated circuits, and more particularly to receivers for receiving multi-level signals, and memory devices including the receivers.

2. Discussion of Related Art

Semiconductor memory devices may be divided into two categories depending upon whether or not they retain stored data when disconnected from a power supply. These categories include volatile memory devices, which lose stored data when disconnected from power, and nonvolatile memory devices, which retain stored data when disconnected from power. While volatile memory devices may perform read and write operations at a high speed, contents stored therein may be lost at power-off. Since nonvolatile memory devices retain contents stored therein even at power-off, they may be used to store data that needs to be retained.

A memory controller and a memory device of a nonvolatile memory device may communicate with one another using multi-level signaling. However, a non-linearity may be caused in data generated by circuits that perform multi-level signaling.

SUMMARY

At least one example embodiment of the present disclosure provides a receiver capable of minimizing non-linearity and reducing power consumption and size while a signal based on multi-level signaling is received.

At least one example embodiment of the present disclosure provides a memory device including the receiver.

According to an example embodiment, a receiver configured to receive a multi-level signal having three or more voltage levels that are different from each other includes a pre-amplifier circuit, a slicer circuit and a decoder circuit. The pre-amplifier circuit generates a plurality of intermediate data signals based on an input data signal that is the multi-level signal and a plurality of reference voltages. The slicer circuit generates a plurality of decision signals based on the plurality of intermediate data signals and a clock signal. The decoder circuit generates output data based on the plurality of decision signals. The output data includes two or more bits. The pre-amplifier circuit includes a first circuit and a second circuit. The first circuit generates one of the plurality of intermediate data signals based on the input data signal and one of the plurality of reference voltages, and has a first structure. The second circuit generates another one of the plurality of intermediate data signals based on the input data signal and another one of the plurality of reference voltages, and has a second structure different from the first structure.

According to an example embodiment, a memory device includes a receiver and a memory cell array. The receiver receives an input data signal that is a multi-level signal having three or more voltage levels that are different from each other. The memory cell array performs a data write operation based on the input data signal. The receiver includes a pre-amplifier circuit, a slicer circuit and a decoder circuit. The pre-amplifier circuit generates a plurality of intermediate data signals based on the input data signal and a plurality of reference voltages. The slicer circuit generates a plurality of decision signals based on the plurality of intermediate data signals and a clock signal. The decoder circuit generates output data based on the plurality of decision signals. The output data includes two or more bits. The pre-amplifier circuit includes a first circuit and a second circuit. The first circuit generates one of the plurality of intermediate data signals based on the input data signal and one of the plurality of reference voltages, and has a first structure. The second circuit generates another one of the plurality of intermediate data signals based on the input data signal and another one of the plurality of reference voltages, and has a second structure different from the first structure.

According to an example embodiment, a receiver configured to receive a multi-level signal having a first voltage level, a second voltage level, a third voltage level and a fourth voltage level that are different from each other includes a pre-amplifier circuit, a slicer circuit and a decoder circuit. The pre-amplifier circuit generates a first intermediate data signal, a second intermediate data signal and a third intermediate data signal based on an input data signal, a first reference voltage, a second reference voltage and a third reference voltage. The input data signal is the multi-level signal. The first reference voltage has a voltage level between the first and second voltage levels. The second reference voltage has a voltage level between the second and third voltage levels. The third reference voltage has a voltage level between the third and fourth voltage levels. The slicer circuit generates a first decision signal, a second decision signal and a third decision signal based on the first, second and third intermediate data signals and a clock signal. The decoder circuit generates output data based on the first, second and third decision signals. The output data includes a first bit and a second bit. The pre-amplifier circuit includes a first level shifter, a second level shifter and a third level shifter. The first level shifter generates the first intermediate data signal by level-shifting the input data signal based on the first reference voltage. The second level shifter generates the second intermediate data signal by level-shifting the input data signal based on the second reference voltage. The third level shifter generates the third intermediate data signal by level-shifting the input data signal based on the third reference voltage. One of the first, second and third level shifters has a structure different from those of remaining of the first, second and third level shifters, or all of the first, second and third level shifters have different structures. The structures of the first, second and third level shifters are determined based on a number, a type, or a connection structure of transistors included in the first, second and third level shifters.

In the receiver and the memory device according to example embodiments, the pre-amplifier circuit may include the circuits (e.g., the level shifters, the continuous time linear equalizers, or the like) having different structures. The circuits may operate based on the reference voltages having different reference levels, and may have structures optimized for corresponding reference levels. The linearity degradation due to a decrease in the headroom margin may be reduced and improved by operating the pre-amplifier circuit optimized for different reference levels. In addition, the power consumption and size may be reduced as compared to a case in which the pre-amplifier circuit includes only circuits having the same structure. Accordingly, the receiver may have improved or enhanced performance.

BRIEF DESCRIPTION OF THE DRAWINGS

Illustrative, non-limiting example embodiments will be more clearly understood from the following detailed description taken in conjunction with the accompanying drawings.

FIG. 3 is a block diagram illustrating an example of a receiver of FIG. 1.

FIG. 4 is a block diagram illustrating an example of level shifters included in a receiver of FIG. 3.

FIG. 5 is a circuit diagram illustrating an example of a second level shifter in FIG. 4.

FIGS. 6, 7 and 8 are circuit diagrams illustrating examples of a first level shifter in FIG. 4.

FIG. 9 is a block diagram illustrating another example of level shifters included in a receiver of FIG. 3.

DETAILED DESCRIPTION OF THE EMBODIMENTS

Figure 1:
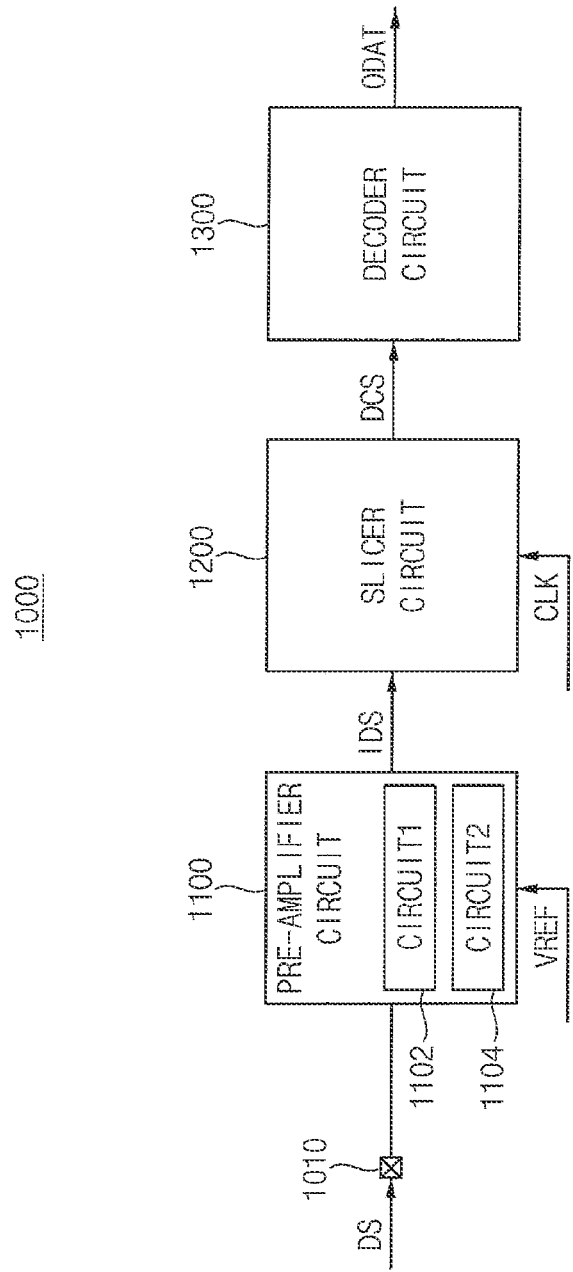
FIG. 1 is a block diagram illustrating a receiver according to an example embodiment.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a block diagram illustrating a receiver according to an example embodiment.

Referring to FIG. 1, a receiver 1000 includes a pre-amplifier circuit 1100, a slicer circuit 1200 and a decoder circuit 1300. The receiver 1000 may further include a data input pad (or pin) 1010.

The receiver 1000 receives an input data signal DS that is a multi-level signal having three or more voltage levels, and generates output data ODAT that is multi-bit data including two or more bits based on the input data signal DS. For example, the multi-level signal may have one of three or more voltage levels that are different from each other during one unit interval (UI), and the multi-bit data may include two or more bits that are different from each other. The receiver 1000 may be included in various communication systems and/or signal transmission systems, and may be included in, for example, a memory device and/or a memory system. Configurations of the receiver 1000, the memory device, the memory system and the multi-level signal will be described in detail later.

The pre-amplifier circuit 1100 generates a plurality of intermediate data signals IDS based on the input data signal DS, which is a multi-level signal having one of three or more voltage levels that are different from each other, and a plurality of reference voltages VREF having reference levels that are different from each other.

The pre-amplifier circuit 1100 includes a first circuit 1102 and a second circuit 1104. The first circuit 1102 generates one of the plurality of intermediate data signals IDS based on the input data signal DS and one of the plurality of reference voltages VREF, and has a first structure. The second circuit 1104 generates another one of the plurality of intermediate data signals IDS based on the input data signal DS and another one of the plurality of reference voltages VREF, and has a second structure different from the first structure.

As described above, the first circuit 1102 and the second circuit 1104 may perform the same function and/or operation and may have different structures. Performing the same function and/or operation may represent that inputs and outputs of the first circuit 1102 and the second circuit 1104 are substantially the same as or similar to each other. Having different structures may represent that design schemes and/or components of the first circuit 1102 and the second circuit 1104 are different from each other.

In some example embodiments, one of the first and second structures may represent an original (or default) structure, and the other of the first and second structures may represent a modified structure in which at least a part is changed from the original structure. Hereinafter, example embodiments will be described in which the first structure is the modified structure and the second structure is the original structure.

In some example embodiments, the first circuit 1102 may include a plurality of first transistors, and the second circuit 1104 may include a plurality of second transistors. The first circuit 1102 and the second circuit 1104 may have different structures and/or design schemes such that the number of the plurality of first transistors is different from the number of the plurality of second transistors, or a type of at least one of the plurality of first transistors is different from a type of at least one of the plurality of second transistors, or a connection structure of at least one of the plurality of first transistors is different from a connection structure of at least one of the plurality of second transistors.

In some example embodiments, the pre-amplifier circuit 1100 may include a plurality of level shifters (LSs). For example, the pre-amplifier circuit 1100 may generate the plurality of intermediate data signals IDS by level-shifting the input data signal DS, and the plurality of intermediate data signals IDS may be referred to as a plurality of level-shifted data signals. For example, each of the first circuit 1102 and the second circuit 1104 may correspond to at least one level shifter.

In other example embodiments, the pre-amplifier circuit 1100 may include a plurality of continuous time linear equalizers (CTLEs). For example, the pre-amplifier circuit 1100 may generate the plurality of intermediate data signals IDS by performing an equalizing (or equalization) operation on the input data signal DS, and the plurality of intermediate data signals IDS may be referred to as a plurality of equalized data signals. For example, each of the first circuit 1102 and the second circuit 1104 may correspond to at least one continuous time linear equalizer.

However, example embodiments are not limited thereto, and types and/or configurations of circuits included in the pre-amplifier circuit 1100 may be variously determined according to example embodiments.

Although FIG. 1 illustrates that the pre-amplifier circuit 1100 includes two circuits 1102 and 1104 having different structures, e.g., circuits having two different structures, example embodiments are not limited thereto. For example, the pre-amplifier circuit 1100 may include three or more circuits having different structures, e.g., circuits having three or more different structures.

The slicer circuit 1200 generates a plurality of decision signals DCS based on the plurality of intermediate data signals IDS and a clock signal CLK. The clock signal may oscillate between two different logic states. For example, the slicer circuit 1200 may include a plurality of sense amplifiers. The slicer circuit 1200 may be referred to as a decision circuit.

The decoder circuit 1300 generates the output data ODAT, which is the multi-bit data including the two or more bits that are different from each other, based on the plurality of decision signals DCS.

The data input pad 1010 may be connected to the pre-amplifier circuit 1100, and may receive the input data signal DS. For example, a pad may be a contact pad or a contact pin, but example embodiments are not limited thereto.

In an example embodiment, the input data signal DS may be a single-ended signal. The receiver 1000 may operate in a pseudo differential scheme based on the input data signal DS, which is the single-ended signal, and the plurality of reference voltages VREF that are different from each other. For example, the single-ended signal may be delivered across two wires where one of the wires provides a varying voltage and the other provides a constant reference voltage such as a ground voltage or another voltage.

In the receiver 1000 according to an example embodiment, the input data signal DS that is generated based on a multi-level signaling scheme is received. The multi-level signaling scheme may be used as a means of compressing the bandwidth required to transmit data at a given bit rate. In a simple binary scheme, two single symbols, usually two voltage levels, may be used to represent '1' and '0', and thus the symbol rate may be equal to the bit rate. In contrast, the principle of the multi-level signaling scheme may use a larger alphabet of m symbols to represent data, so that each symbol may represent more than one bit of data. As a result, the number of symbols that needs to be transmitted may be less than the number of bits (e.g., the symbol rate may be less than the bit rate), and thus the bandwidth may be compressed. The alphabet of symbols may be constructed from a number of different voltage levels. For example, in a four-level scheme, groups of two data bits may be mapped to one of four symbols. Only one symbol need be transmitted for each pair of data bits, so the symbol rate may be a half of the bit rate.

In other words, the multi-level signaling scheme may be used to increase a data transmission (or transfer) rate without increasing the frequency of data transmission and/or a transmission power of the communicated data. An example of one type of the multi-level signaling scheme is a pulse amplitude modulation (PAM) scheme, where a unique symbol of a multi-level signal may represent a plurality of bits of data. The number of possible pulse amplitudes in a digital PAM scheme may be some power of two. For example, there may be $2^2$ possible discrete pulse amplitudes in a 4-level PAM (e.g., in PAM4), there may be $2^3$ possible discrete pulse amplitudes in an 8-level PAM (e.g., in PAM8), and there may be $2^4$ possible discrete pulse amplitudes in a 16-level PAM (e.g., in PAM16). However, example embodiments are not limited thereto, and example embodiments may be applied or employed to an X-level PAM (e.g., PAM(X)) having X possible pulse amplitudes, where X is a natural number greater than or equal to three.

In the receiver 1000 according to an example embodiment, the pre-amplifier circuit 1100 include the circuits 1102 and 1104 having different structures. The circuits 1102 and 1104 may operate based on the reference voltages having different reference levels, and may have structures optimized for corresponding reference levels. A linearity degradation due to a decrease in headroom margin may be reduced by operating the pre-amplifier circuit 1100 optimized for different reference levels. In addition, the power consumption and size may be reduced as compared to a case in which the pre-amplifier circuit includes only circuits having the same structure. Accordingly, the receiver 1000 may have enhanced performance.

Figure 2A:
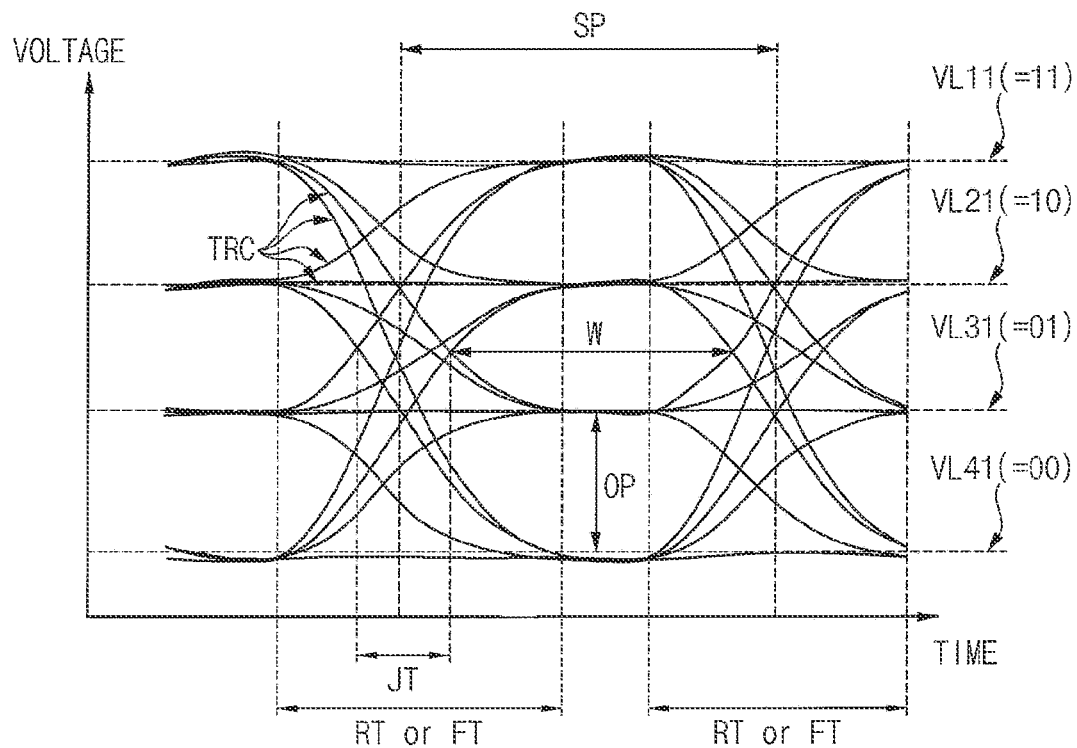
FIGS. 2A and 2B are diagrams for describing a data signal that is input to a receiver according to an example embodiment.
Figure 2B:
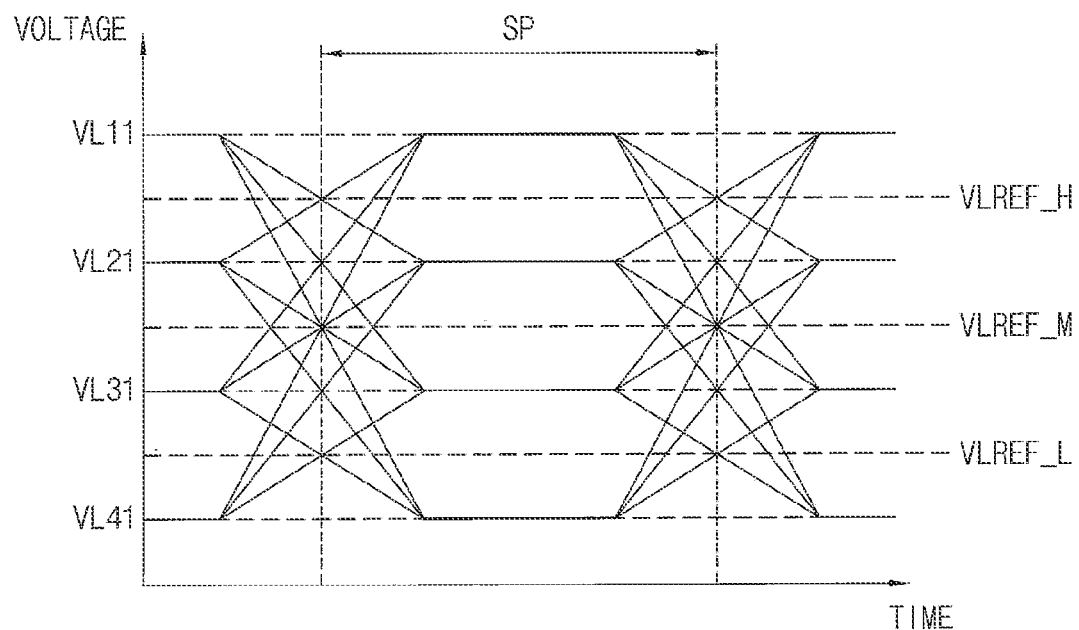

FIGS. 2A and 2B are diagrams for describing a data signal that is input to a receiver according to an example embodiment.

FIG. 2A illustrates an ideal eye diagram of a data signal (e.g., a PAM4 signal) generated based on the 4-level scheme (e.g., the PAM4 scheme) that is an example of the multi-level signaling scheme (e.g., the PAM scheme). FIG. 2B is a diagram illustrated by simplifying the ideal eye diagram of FIG. 2A.

Referring to FIG. 2A, an eye diagram may be used to indicate the quality of signals in high-speed transmissions. For example, the eye diagram may represent four symbols of a signal (e.g., '00,' '01,' '10' and '11'), and each of the four symbols may be represented by a respective one of different voltage levels (e.g., voltage amplitudes) VL11, VL21, VL31 and VL41. The eye diagram may be used to provide a visual indication of the health of the signal integrity, and may indicate noise margins of the data signal. For example, when a binary code is used as illustrated in FIG. 2A, the voltage levels VL11, VL21, VL31 and VL41 may be mapped to '11', '10', '01', and '00', respectively. In another example, when a Gray code is used, the voltage levels VL11, VL21, VL31 and VL41 may be mapped to '10', '11', '01', and '00', respectively.

To generate the eye diagram, an oscilloscope or other computing device may sample a digital signal according to a sample period SP (e.g., a unit interval or a bit period). The sample period SP may be defined by a clock signal associated with the transmission of the measured signal. The oscilloscope or other computing device may measure the voltage level of the signal during the sample period SP to form a plurality of traces TRC. Various characteristics associated with the measured signal may be determined by overlaying the plurality of traces TRC.

The eye diagram may be used to identify a number of characteristics of a communication signal such as jitter, cross talk, electromagnetic interference (EMI), signal loss, signal-to-noise ratio (SNR), other characteristics, or combinations thereof. For example, a width W of an eye in the eye diagram may be used to indicate a timing synchronization of the measured signal or jitter effects of the measured signal. For example, the eye diagram may indicate an eye opening OP, which represents a peak-to-peak voltage difference between the various voltage levels VL11, VL21, VL31 and VL41. The eye opening OP may be related to a voltage margin for discriminating between different voltage levels VL11, VL21, VL31 and VL41 of the measured signal. For example, the eye diagram may be used to identify a rise time RT and/or a fall time FT for transitions from a first amplitude to a second amplitude. The rise time RT or the fall time FT may indicate a time required for transitioning from one voltage level to another voltage level, or may be related to or associated with a rising edge and a falling edge, respectively. For example, the eye diagram may be used to identify the amount of jitter JT in the measured signal. The jitter JT may refer to a timing error that results from a misalignment of rise and fall times. The jitter JT may occur when the rising edge or the falling edge occurs at a time that is different from an ideal time defined by the data clock signal. The jitter JT may be caused by signal reflections, intersymbol interference, crosstalk, process-voltage-temperature (PVT) variations, random jitter, additive noise, or combinations thereof.

Referring to FIG. 2B, different first, second, third and fourth voltage levels VL11, VL21, VL31 and VL41 of the data signal that is the PAM4 signal are illustrated, and different first, second and third reference levels VLREF_H, VLREF_M and VLREF_L for sensing or detecting the level of the data signal are illustrated. For example, the number of the reference levels may be less than the number of the voltage levels of the data signal by one.

The first voltage level VL11 that is the highest voltage level among the voltage levels VL11, VL21, VL31 and VL41 may be higher than the second voltage level VL21, the second voltage level VL21 may be higher than the third voltage level VL31, and the third voltage level VL31 may be higher than the fourth voltage level VL41 that is the lowest voltage level among the voltage levels VL11, VL21, VL31 and VL41. In addition, the first reference level VLREF_H may be a voltage level between the first and second voltage levels VL11 and VL21, the second reference level VLREF_M may be a voltage level between the second and third voltage levels VL21 and VL31, and the third reference level VLREF_L may be a voltage level between the third and fourth voltage levels VL31 and VL41. The voltage level (e.g., the symbol) of the data signal may be decided or determined based on a result of comparing the data signal with the reference levels VLREF_H, VLREF_M and VLREF_L.

Hereinafter, example embodiments will be described in detail based on the PAM4 scheme (or PAM8 scheme). However, example embodiments are not limited thereto, and example embodiments may be applied or employed to the PAM(K) scheme having K possible pulse amplitudes.

FIG. 3 is a block diagram illustrating an example of a receiver of FIG. 1 according to an example embodiment.

Referring to FIG. 3, a receiver 1000a includes a pre-amplifier circuit 1100a, a slicer circuit 1200a and a decoder circuit 1300a. The receiver 1000a may be used to implement the receiver 1000 of FIG. 1. The receiver 1000a may further include a data input pad 1010. For example, the receiver 1000a may be a PAM4 receiver that receives an input data signal DS1 that is generated based on the PAM4 scheme and/or is the PAM4 signal.

The data input pad 1010 may receive the input data signal DS1 having one of the first, second, third and fourth voltage levels VL11, VL21, VL31 and VL41 in FIG. 2B during one unit interval.

The pre-amplifier circuit 1100a may include a first pre-amplifier 1110, a second pre-amplifier 1120 and a third pre-amplifier 1130. The slicer circuit 1200a may include a first sense amplifier 1210, a second sense amplifier 1220 and a third sense amplifier 1230. The decoder circuit 1300a may include a PAM4 decoder 1310.

In some example embodiments, the input data signal DS1 may be a signal having a relatively low voltage level. For example, the input data signal DS1 may be generated or received based on a low voltage swing terminated logic (LVSTL) scheme, and may swing or toggle between about 0V and about VDD/2.

When the input data signal DS1 is received based on the LVSTL scheme and/or is an LVSTL signal, each of the pre-amplifiers 1110, 1120 and 1130 may include a level shifter. For example, the first pre-amplifier 1110 may include a first level shifter, the second pre-amplifier 1120 may include a second level shifter, and the third pre-amplifier 1130 may include a third level shifter. For example, each of the level shifters may include p-type metal oxide semiconductor (PMOS) transistors, and each of the sense amplifiers 1210, 1220 and 1230 may include n-type metal oxide semiconductor (NMOS) transistors.

To receive or input an LVSTL signal, a receiver may be implemented with sense amplifiers including PMOS transistors. However, NMOS transistors may have a smaller size and a higher gain value than the PMOS transistor, and thus it may be more efficient to implement a receiver to include sense amplifiers including NMOS transistors. To implement a receiver to include sense amplifiers including NMOS transistors, level shifters for level-shifting an LVSTL signal may be disposed or located in front of the sense amplifiers, and the level shifters may include PMOS transistors.

For example, the first level shifter may generate a first intermediate data signal IDS_H by level-shifting the input data signal DS1 based on the input data signal DS1 and a first reference voltage VREF_H. The second level shifter may generate a second intermediate data signal IDS_M by level-shifting the input data signal DS1 based on the input data signal DS1 and a second reference voltage VREF_M. The third level shifter may generate a third intermediate data signal IDS_L by level-shifting the input data signal DS1 based on the input data signal DS1 and the third reference voltage VREF_L. For example, the first, second and third reference voltages VREF_H, VREF_M and VREF_L may have the first, second and third reference levels VLREF_H, VLREF_M and VLREF_L in FIG. 2B, respectively.

In an example embodiment, the input data signal DS1 may be a signal having a relatively high voltage level. For example, the input data signal DS1 may be generated or received based on a pseudo open drain (POD) termination scheme, and may swing or toggle between about VDD/2 and about VDD.

When the input data signal DS1 is received based on the POD termination scheme and/or is a POD termination signal, each of the pre-amplifiers 1110, 1120 and 1130 may include a continuous time linear equalizer. For example, the first pre-amplifier 1110 may include a first continuous time linear equalizer, the second pre-amplifier 1120 may include a second continuous time linear equalizer, and the third pre-amplifier 1130 may include a third continuous time linear equalizer. For example, each of the continuous time linear equalizers may include NMOS transistors, and each of the sense amplifiers 1210, 1220 and 1230 may include NMOS transistors.

For example, the first continuous time linear equalizer may generate the first intermediate data signal IDS_H by equalizing the input data signal DS1 based on the input data signal DS1 and the first reference voltage VREF_H. The second continuous time linear equalizer may generate the second intermediate data signal IDS_M by equalizing the input data signal DS1 based on the input data signal DS1 and the second reference voltage VREF_M. The third continuous time linear equalizer may generate the third intermediate data signal IDS_L by equalizing the input data signal DS1 based on the input data signal DS1 and the third reference voltage VREF_L.

In an example embodiment, at least one of the first, second and third pre-amplifiers 1110, 1120 and 1130 may correspond to the first circuit 1102 in FIG. 1, and at least another one of the first, second and third pre-amplifiers 1110, 1120 and 1130 may correspond to the second circuit 1104 in FIG. 1.

The first sense amplifier 1210 may generate a first decision signal DCS_H based on the first intermediate data signal IDS_H and the clock signal CLK. The second sense amplifier 1220 may generate a second decision signal DCS_M based on the second intermediate data signal IDS_M and the clock signal CLK. The third sense amplifier 1230 may generate a third decision signal DCS_L based on the third intermediate data signal IDS_L and the clock signal CLK.

For example, the first decision signal DCS_H may have a first logic level (e.g., '1') when a voltage level of the input data signal DS1 is greater than the first reference level VLREF_H of the first reference voltage VREF_H, and may have a second logic level (e.g., '0') when the voltage level of the input data signal DS1 is less than or equal to the first reference level VLREF_H. Similarly, the second decision signal DCS_M may have the first logic level when the voltage level of the input data signal DS1 is greater than the second reference level VLREF_M of the second reference voltage VREF_M, and may have the second logic level when the voltage level of the input data signal DS1 is less than or equal to the second reference level VLREF_M. The third decision signal DCS_L may have the first logic level when the voltage level of the input data signal DS1 is greater than the third reference level VLREF_L of the third reference voltage VREF_L, and may have the second logic level when the voltage level of the input data signal DS1 is less than or equal to the third reference level VLREF_L.

The PAM4 decoder 1310 may generate output data ODAT1 including a first bit MSB1 and a second bit LSB1 based on the first, second and third decision signals DCS_H, DCS_M and DCS_L. The first and second bits MSB1 and LSB1 may be a most significant bit (MSB) and a least significant bit (LSB) of the output data ODAT1, respectively. For example, when the output data ODAT1 is '10', the first bit MSB1 may be '1' and the second bit LSB1 may be '0'.

For example, when all of the first, second and third decision signals DCS_H, DCS_M and DCS_L have the first logic level (e.g., '1'), the PAM4 decoder 1310 may determine that the input data signal DS1 has the first voltage level VL11 in FIGS. 2A and 2B, and may generate the output data ODAT1 of '11'. Similarly, when the first decision signal DCS_H has the second logic level (e.g., '0') and the second and third decision signals DCS_M and DCS_L have the first logic level, the PAM4 decoder 1310 may determine that the input data signal DS1 has the second voltage level VL21 in FIGS. 2A and 2B, and may generate the output data ODAT1 of '10'. When the first and second decision signals DCS_H and DCS_M have the second logic level and the third decision signal DCS_L has the first logic level, the PAM4 decoder 1310 may determine that the input data signal DS1 has the third voltage level VL31 in FIGS. 2A and 2B, and may generate the output data ODAT1 of '01'. When all of the first, second and third decision signals DCS_H, DCS_M and DCS_L have the second logic level, the PAM4 decoder 1310 may determine that the input data signal DS1 has the fourth voltage level VL41 in FIGS. 2A and 2B, and may generate the output data ODAT1 of '00'.

The receiver 1000a according to an example embodiment may be implemented such that at least some of the pre-amplifiers 1110, 1120 and 1130 have different structures as needed. For example, the pre-amplifiers 1110, 1120 and 1130 may operate based on the reference voltages VREF_H, VREF_M and VREF_L having different reference levels VLREF_H, VLREF_M and VLREF_L, and may have different structures optimized for corresponding reference levels. Accordingly, the receiver 1000 may have an enhanced linearity characteristic.

FIG. 4 is a block diagram illustrating an example of level shifters included in a receiver of FIG. 3.

Referring to FIG. 4, a first level shifter (LS_H) 1112, a second level shifter (LS_M) 1122 and a third level shifter (LS_L) 1132 may correspond to the first pre-amplifier 1110, the second pre-amplifier 1120 and the third pre-amplifier 1130 in FIG. 3, respectively. For example, the first pre-amplifier 1110 may include the first level shifter (LS_H) 1112, the second pre-amplifier 1120 may include the second level shifter (LS_M) 1122, and the third pre-amplifier may include the third level shifter (LS_L) 1132.

The first level shifter 1112 may be implemented as a first type TYPE1, and each of the second and third level shifters 1122 and 1132 may be implemented as a second type TYPE2 different from the first type TYPE 1. For example, the second type TYPE2 may represent an original structure of a original level shifter included in an original receiver, and the first type TYPE1 may represent a first modified structure of a level shifter, which is at least partially changed from the second type TYPE2. In other words, the first level shifter 1112 may correspond to the first circuit 1102 having the first structure in FIG. 1, and the second and third level shifters 1122 and 1132 may correspond to the second circuit 1104 having the second structure in FIG. 1.

The first level shifter 1112 of the first type TYPE1 and the second and third level shifters 1122 and 1132 of the second type TYPE2 may perform the same function and/or operation and may have different structures. For example, when the input data signal DS1 having the same voltage level (e.g., the first voltage level VL11) and the same reference voltage (e.g., the first reference voltage VREF_H) are input to the first level shifter 1112 of the first type TYPE1 and the second level shifter 1122 of the second type TYPE2, a voltage level of an intermediate data signal generated by the first level shifter 1112 and a voltage level of an intermediate data signal generated by the second level shifter 1122 may be different from each other. For example, the voltage level of the intermediate data signal generated by the first level shifter 1112 may be higher than the voltage level of the intermediate data signal generated by the second level shifter 1122.

In an example of FIG. 4, a structure of the first level shifter 1112 to which a relatively high voltage level is input may be modified or changed. When the input voltage level is relatively high, the voltage margin of the level shifter may be insufficient (e.g., the headroom margin is reduced), which may cause linearity degradation. Therefore, the structure of the level shifter may be modified so that a value shifted by the level shifter is changed, and thus the linearity characteristic may be improved without violating the headroom margin.

FIG. 5 is a circuit diagram illustrating an example of a second level shifter in FIG. 4.

Referring to FIG. 5, the second level shifter 1122 may include first input transistors IT21, second input transistors IT22, a first output transistor OT21 and a second output transistor OT22.

In FIG. 5 and following figures, a single straight line connected to one end of a transistor denotes a power supply voltage (e.g., VDD), and three straight lines connected to the other end of the transistor denotes a ground voltage (e.g., VSS).

The first input transistors IT21 may be connected in parallel between a first output node N21 and the ground voltage, and may have gate electrodes commonly receiving the input data signal DS1. The second input transistors IT22 may be connected in parallel between a second output node N22 and the ground voltage, and may have gate electrodes commonly receiving the second reference voltage VREF_M. The gate electrodes of the first input transistors IT21 may correspond to an input terminal of the second level shifter 1122, and the gate electrodes of the second input transistors IT22 may correspond to an inverted input terminal of the second level shifter 1122.

The first output transistor OT21 may be connected between the power supply voltage and the first output node N21, and has a gate electrode. The second output transistor OT22 may be connected between the power supply voltage and the second output node N22, and has a gate electrode connected to the gate electrode of the first output transistor OT21. The second intermediate data signal IDS_M may be output through the first output node N21, and an inverted second intermediate data signal /IDS_M may be output through the second output node N22. The first output node N21 may correspond to an output terminal of the second level shifter 1122, and the second output node N22 may correspond to an inverted output terminal of the second level shifter 1122.

The first input transistors IT21 and the second input transistors IT22 may have a first threshold voltage Vth and a first overdrive voltage Vov. For example, an output voltage of the second level shifter 1122 may be determined based on Equation 1.

$$Vout=VDD-(Vin+Vov+Vth)$$ [Equation 1]

In Equation 1, Vout (or Vds) denotes a voltage at the first output node N21 that is an output of the second level shifter 1122 (e.g., the second intermediate data signal IDS_M), VDD denotes the power supply voltage, Vin denotes a voltage at the gate electrodes of the first input transistors IT21 that is an input of the second level shifter 1122 (e.g., the input data signal DS1), Vov denotes the first overdrive voltage, and Vth denotes the first threshold voltage. In other words, the input of the second level shifter 1122 may be output by shifting by (Vov+Vth) of the input transistors.

Although not illustrated in detail, the third level shifter 1132 may have a structure substantially the same as that of the second level shifter 1122 illustrated in FIG. 5, except that the second reference voltage VREF_M, the second intermediate data signal IDS_M and the inverted second intermediate data signal /IDS_M in FIG. 5 are replaced with the third reference voltage VREF_L, the third intermediate data signal IDS_L and an inverted third intermediate data signal (e.g., /IDS_L), respectively.

Figure 6:
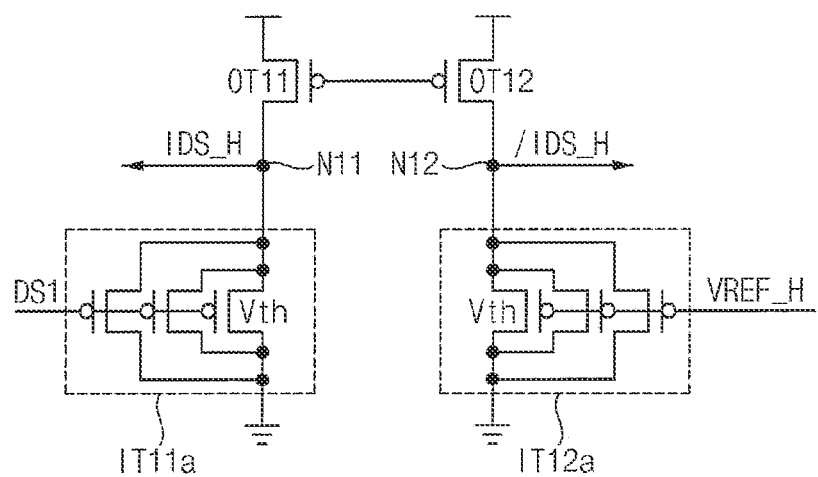
Figure 7:
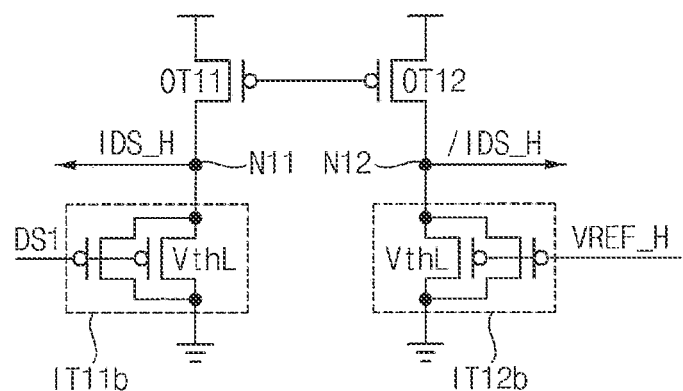

FIGS. 6, 7 and 8 are circuit diagrams illustrating examples of a first level shifter in FIG. 4. The descriptions repeated with FIG. 5 will be omitted.

Referring to FIGS. 6, 7 and 8, in each of first level shifters 1112a, 1112b and 1112c, an input voltage level is relatively high, and a structure may be modified so that a value shifted by the level shifter is changed, e.g., an overdrive voltage and/or a threshold voltage are changed. The headroom margin (e.g., the headroom of transistors in charge of biasing) may be violated by (Vin+Vov+Vth) in Equation 1, and thus the violation of the headroom margin may be prevented by modifying the structure.

In an example embodiment, as illustrated in FIG. 6, the first level shifter 1112a may have a structure for decreasing the overdrive voltage. The level shifter 1112 of FIG. 4 may be implemented by the first level shifter 1112a. For example, the number of transistors included in the first level shifter 1112a may be changed.

For example, the first level shifter 1112a may include first input transistors IT11a, second input transistors IT12a, a first output transistor OT11 and a second output transistor OT12.

The first input transistors IT11a may be connected in parallel between a first output node N11 outputting the first intermediate data signal IDS_H and the ground voltage, and may have gate electrodes commonly receiving the input data signal DS1. The second input transistors IT12a may be connected in parallel between a second output node N12 outputting an inverted first intermediate data signal /IDS_H and the ground voltage, and may have gate electrodes commonly receiving the first reference voltage VREF_H. The first output transistor OT11 may be connected between the power supply voltage and the first output node N11, and may have a gate electrode. The second output transistor OT12 may be connected between the power supply voltage and the second output node N12, and may have a gate electrode connected to the gate electrode of the first output transistor OT11.

In an embodiment, the number of the first input transistors IT11a and the number of the second input transistors IT12a included in the first level shifter 1112a is greater than the number of the first input transistors IT21 and the number of the second input transistors IT22 included in the second level shifter 1122. For example, the number of the first input transistors IT11a and the number of the second input transistors IT12a may be three, respectively, and the number of the first input transistors IT21 and the number of the second input transistors IT22 may be two, respectively. However, example embodiments are not limited thereto.

As compared with the second level shifter 1122, the number of the first input transistors IT11a and the number of the second input transistors IT12a included in the first level shifter 1112a may increase, and the first input transistors IT11a and the second input transistors IT12a may have a second overdrive voltage lower than the first overdrive voltage Vov of the first input transistors IT21 and the second input transistors IT22. Accordingly, a voltage level of an output voltage of the first level shifter 1112a may increase.

Although FIG. 6 illustrates an example where the number of the input transistors is changed (e.g., increased), example embodiments are not limited thereto. For example, a size and/or channel width of the input transistors may be changed, and the overdrive voltage may decrease when the size and/or channel width of the input transistors increases.

In an example embodiment, as illustrated in FIG. 7, the first level shifter 1112b may have a structure for decreasing the threshold voltage. For example, the types of transistors included in the first level shifter 1112b may be changed. The level shifter 1112 of FIG. 4 may be implemented by the first level shifter 1112b.

For example, the first level shifter 1112b may include first input transistors IT11b, second input transistors IT12b, a first output transistor OT11 and a second output transistor OT12.

The first input transistors IT11b may be connected in parallel between the first output node N11 and the ground voltage, and may have gate electrodes commonly receiving the input data signal DS1. The second input transistors IT12b may be connected in parallel between the second output node N12 and the ground voltage, and may have gate electrodes commonly receiving the first reference voltage VREF_H. The first and second output transistors OT11 and OT12 may be substantially the same as the first and second output transistors OT11 and OT12 in FIG. 6, respectively.

The first input transistors IT11b and the second input transistors IT12b included in the first level shifter 1112b may have a second threshold voltage VthL lower than the first threshold voltage Vth of the first input transistors IT21 and the second input transistors IT22 included in the second level shifter 1122. Accordingly, a voltage level of an output voltage of the first level shifter 1112b may increase.

In an embodiments, as illustrated in FIG. 8, the first level shifter 1112c may have a structure for decreasing the threshold voltage. The level shifter 1112 of FIG. 4 may be implemented by the first level shifter 1112c. For example, a connection structure of transistors included in the first level shifter 1112c may be changed.

For example, the first level shifter 1112c may include first input transistors IT11c, second input transistors IT12c, a first output transistor OT11 and a second output transistor OT12.

The first input transistors IT11c may be connected in parallel between the first output node N11 and the ground voltage, may have gate electrodes commonly receiving the input data signal DS1, and a body of the first input transistors IT11c may be connected to the first output node N11 such that a voltage at the first output node N11 (e.g., the first intermediate data signal IDS_H) is received as a body bias voltage. The second input transistors IT12c may be connected in parallel between the second output node N12 and the ground voltage, may have gate electrodes commonly receiving the first reference voltage VREF_H, and a body of the second input transistors IT12c may be connected to the second output node N12 such that a voltage at the second output node N12 (e.g., the inverted first intermediate data signal /IDS_H) is received as a body bias voltage. The first and second output transistors OT11 and OT12 may be substantially the same as the first and second output transistors OT11 and OT12 in FIG. 6, respectively.

Based on a connection structure of PMOS transistors, the first input transistors IT21 and the second input transistors IT22 included in the second level shifter 1122 may receive the power supply voltage as a body bias voltage. In contrast, the body bias voltages of the first input transistors IT11c and the second input transistors IT12c included in the first level shifter 1112c may be lower than the power supply voltage, which is the body bias voltage of the first input transistors IT21 and the second input transistors IT22 included in the second level shifter 1122. Accordingly, a voltage level of an output voltage of the first level shifter 1112c may increase.

In some example embodiments, the first level shifter of the first type TYPE1 may be implemented by combining at least two of the examples of FIGS. 6, 7 and 8.

FIG. 9 is a block diagram illustrating an example of level shifters included in a receiver of FIG. 3. The descriptions repeated with FIG. 4 will be omitted.

Referring to FIG. 9, a first level shifter 1114, a second level shifter 1124 and a third level shifter 1134 may correspond to the first pre-amplifier 1110, the second pre-amplifier 1120 and the third pre-amplifier 1130 in FIG. 3, respectively. For example, the first level shifter 1114 may be included in the first pre-amplifier 1110, the second level shifter 1124 may be included in the second pre-amplifier 1120 and the third level shifter 1134 may be included in the third pre-amplifier 1130.

The third level shifter 1134 may be implemented as a third type TYPE3 different from the first type TYPE1 and the second type TYPE2, and each of the first and second level shifters 1114 and 1124 may be implemented as the second type TYPE2. For example, the third type TYPE3 may represent a second modified structure of a level shifter, which is at least partially changed from the second type TYPE2. In other words, the third level shifter 1134 may correspond to the first circuit 1102 having the first structure in FIG. 1, and the first and second level shifters 1114 and 1124 may correspond to the second circuit 1104 having the second structure in FIG. 1.

A structure of the second level shifter 1124 of the second type TYPE2 may be substantially the same as that of the second level shifter 1122 described with reference to FIGS. 4 and 5. A structure of the first level shifter 1114 of the second type TYPE2 may be substantially the same as that of the second level shifter 1124.

The third level shifter 1134 of the third type TYPE3 and the first and second level shifters 1114 and 1124 of the second type TYPE2 may perform the same function and/or operation and may have different structures. For example, when the input data signal DS1 having the same voltage level and the same reference voltage are input to the second level shifter 1124 of the second type TYPE2 and the third level shifter 1134 of the third type TYPE3, a voltage level of an intermediate data signal generated by the third level shifter 1134 and a voltage level of an intermediate data signal generated by the second level shifter 1124 may be different from each other. For example, the voltage level of the intermediate data signal generated by the third level shifter 1134 may be lower than the voltage level of the intermediate data signal generated by the second level shifter 1124.

In an example of FIG. 9, a structure of the third level shifter 1134 to which a relatively low voltage level is input may be modified or changed.

Figure 10:
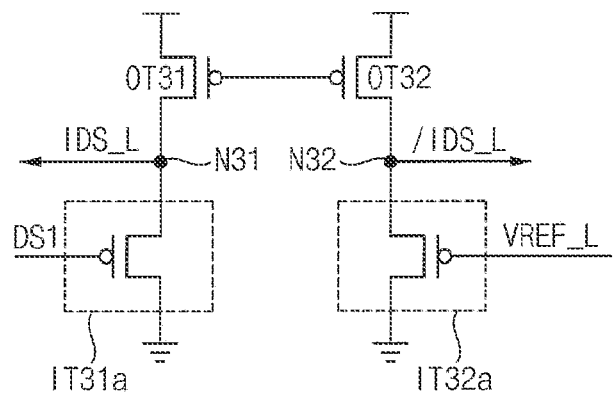
FIGS. 10 and 11 are circuit diagrams illustrating examples of a third level shifter in FIG. 9.
Figure 11:
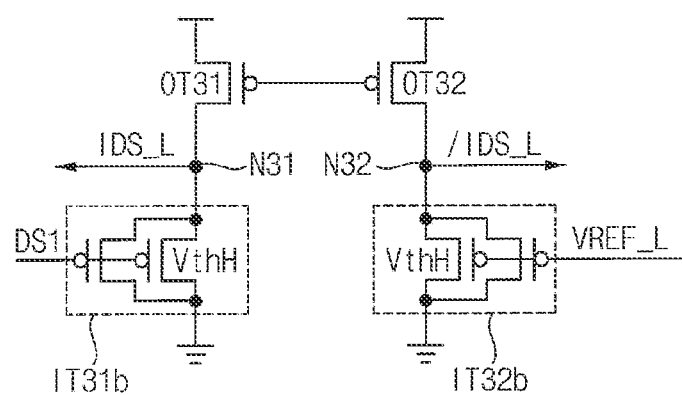

FIGS. 10 and 11 are circuit diagrams illustrating examples of a third level shifter in FIG. 9. The descriptions repeated with FIGS. 6 and 7 will be omitted.

Referring to FIGS. 10 and 11, in each of third level shifters 1134a and 1134b, an input voltage level is relatively low, and a structure may be modified so that a value shifted by the level shifter is changed, e.g., an overdrive voltage and/or a threshold voltage are changed.

In an example embodiment, as illustrated in FIG. 10, the third level shifter 1134a may have a structure for increasing the overdrive voltage. The third level shifter 1134 of FIG. 9 may be implemented by the third level shifter 1134a.

For example, the third level shifter 1134a may include a first input transistor IT31a, a second input transistor IT32a, a first output transistor OT31 and a second output transistor OT32.

The first input transistor IT31a may be connected between a first output node N31 outputting the third intermediate data signal IDS_L and the ground voltage, and may have a gate electrode receiving the input data signal DS1. The second input transistor IT32a may be connected between a second output node N32 outputting an inverted third intermediate data signal /IDS_L and the ground voltage, and may have a gate electrode receiving the third reference voltage VREF_L. The first output transistor OT31 may be connected between the power supply voltage and the first output node N31, and may have a gate electrode. The second output transistor OT32 may be connected between the power supply voltage and the second output node N32, and may have a gate electrode connected to the gate electrode of the first output transistor OT31.

The number of the first input transistor IT31a and the number of the second input transistor IT32a included in the third level shifter 1134a may be less than the number of the first input transistors IT21 and the number of the second input transistors IT22 included in the second level shifter 1122. For example, the number of the first input transistor IT31a and the number of the second input transistor IT32a may be one, respectively, and the number of the first input transistors IT21 and the number of the second input transistors IT22 may be two, respectively. However, example embodiments are not limited thereto.

As compared with the second level shifter 1122, the number of the first input transistor IT31a and the number of the second input transistor IT32a included in the third level shifter 1134a may decrease, and the first input transistor IT31a and the second input transistor IT32a may have a third overdrive voltage higher than the first overdrive voltage Vov of the first input transistors IT21 and the second input transistors IT22. Accordingly, a voltage level of an output voltage of the third level shifter 1134a may decrease.

Although FIG. 10 illustrates an example where the number of the input transistors is changed (e.g., decreased), example embodiments are not limited thereto. For example, a size and/or channel width of the input transistors may be changed, and the overdrive voltage may increase when the size and/or channel width of the input transistors decreases.

In an example embodiment, as illustrated in FIG. 11, the third level shifter 1134b may have a structure for increasing the threshold voltage. The third level shifter 1134 of FIG. 9 may be implemented by the third level shifter 1134b.

For example, the third level shifter 1134b may include first input transistors IT31b, second input transistors IT32b, a first output transistor OT31 and a second output transistor OT32.

The first input transistors IT31b may be connected in parallel between the first output node N31 and the ground voltage, and may have gate electrodes commonly receiving the input data signal DS1. The second input transistors IT32b may be connected in parallel between the second output node N32 and the ground voltage, and may have gate electrodes commonly receiving the third reference voltage VREF_L. The first and second output transistors OT31 and OT32 may be substantially the same as the first and second output transistors OT31 and OT32 in FIG. 10, respectively.

The first input transistors IT31b and the second input transistors IT32b included in the third level shifter 1134b may have a third threshold voltage VthH higher than the first threshold voltage Vth of the first input transistors IT21 and the second input transistors IT22 included in the second level shifter 1122. Accordingly, a voltage level of an output voltage of the third level shifter 1134b may decrease.

In an example embodiment, the third level shifter of the third type TYPE3 may be implemented by combining the examples of FIGS. 10 and 11.

Figure 12A:
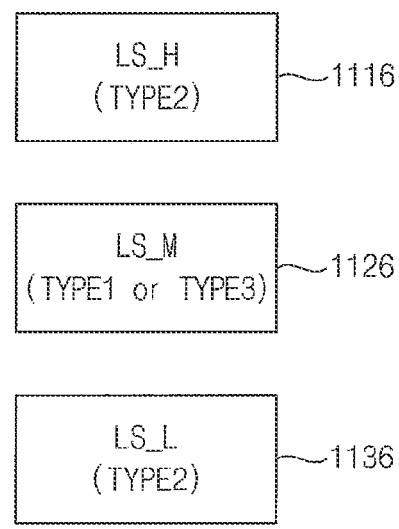
FIGS. 12A and 12B are block diagrams illustrating other examples of level shifters included in a receiver of FIG. 3.
Figure 12B:
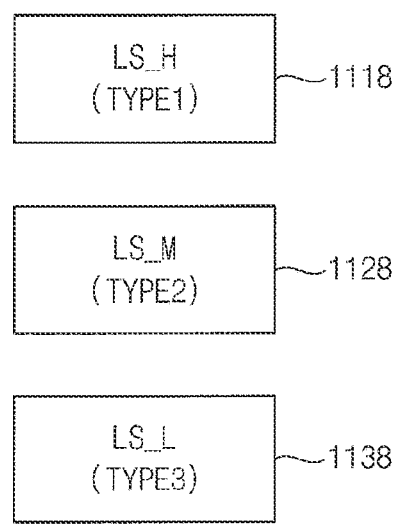

FIGS. 12A and 12B are block diagrams illustrating other examples of level shifters included in a receiver of FIG. 3. The descriptions repeated with FIGS. 4 and 9 will be omitted.

Referring to FIG. 12A, a first level shifter 1116, a second level shifter 1126 and a third level shifter 1136 may correspond to the first pre-amplifier 1110, the second pre-amplifier 1120 and the third pre-amplifier 1130 in FIG. 3, respectively. For example, the first level shifter 1116 may be included in the first pre-amplifier 1110, the second level shifter 1126 may be included in the second pre-amplifier 1120 and the third level shifter 1136 may be included in the third pre-amplifier 1130.

The second level shifter 1126 may be implemented as the first type TYPE1 or the third type TYPE3, and each of the first and third level shifters 1116 and 1136 may be implemented as the second type TYPE2. In other words, the second level shifter 1126 may correspond to the first circuit 1102 having the first structure in FIG. 1, and the first and third level shifters 1116 and 1136 may correspond to the second circuit 1104 having the second structure in FIG. 1.

A structure of the first level shifter 1116 and a structure of the third level shifter 1136 may be substantially the same as that of the first level shifter 1114 in FIG. 9 and that of the third level shifter 1132 in FIG. 4, respectively. The second level shifter 1126 may have a structure substantially the same as that described with reference to FIGS. 4, 6, 7 and 8, or a structure substantially the same as that described with reference to FIGS. 9, 10 and 11.

In an example of FIG. 12A, the structure of the second level shifter 1126 may be modified or changed.

Referring to FIG. 12B, a first level shifter 1118, a second level shifter 1128 and a third level shifter 1138 may correspond to the first pre-amplifier 1110, the second pre-amplifier 1120 and the third pre-amplifier 1130 in FIG. 3, respectively. For example, the first level shifter 1118 may be included in the first pre-amplifier 1110, the second level shifter 1128 may be included in the second pre-amplifier 1120 and the third level shifter 1138 may be included in the third pre-amplifier 1130.

The first level shifter 1118 may be implemented as the first type TYPE1, the second level shifter 1128 may be implemented as the second type TYPE2, and the third level shifter 1138 may be implemented as the third type TYPE3. In other words, the pre-amplifier circuit 1100 in FIG. 1 may further include a third circuit having a third structure different from the first and second structures, the first level shifter 1118 may correspond to the first circuit 1102 having the first structure in FIG. 1, the second level shifter 1128 may correspond to the second circuit 1104 having the second structure in FIG. 1, and the third level shifter 1138 may correspond to the third circuit having the third structure. A structure of the first level shifter 1118, a structure of the second level shifter 1128, and a structure of the third level shifter 1138 may be substantially the same as that of the first level shifter 1112 in FIG. 4, that of the second level shifter 1122 in FIG. 4, and that of the third level shifter 1134 in FIG. 9, respectively.

In an example of FIG. 12B, both a structure of the first level shifter 1118 to which a relatively high voltage level is input and a structure of the third level shifter 1138 to which a relatively low voltage level is input may be modified or changed.

FIGS. 13A, 13B, 13C, 13D, 13E, 13F, 13G and 13H are diagrams illustrating examples of continuous time linear equalizers included in a receiver of FIG. 3.

Figure 13A:
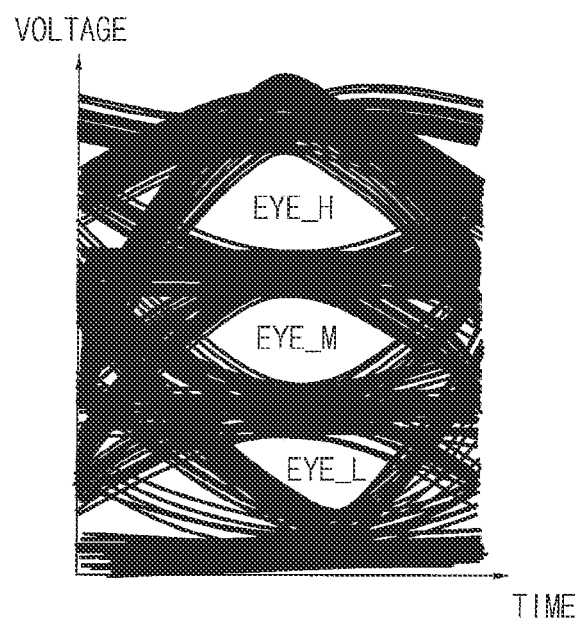
FIGS. 13A, 13B, 13C, 13D, 13E, 13F, 13G and 13H are diagrams illustrating examples of continuous time linear equalizers included in a receiver of FIG. 3.

Referring to FIG. 13A, an example of an eye diagram of the PAM4 signal is illustrated.

The pre-amplifiers 1110, 1120 and 1130 in FIG. 3 may operate based on the reference voltages VREF_H, VREF_M and VREF_L having different reference levels VLREF_H, VLREF_M and VLREF_L, and thus operation regions and delays of the pre-amplifiers 1110, 1120 and 1130 may be different from each other. For example, as illustrated in FIG. 13A, a first eye EYE_H between the first and second voltage levels VL11 and VL21 may start first, a second eye EYE_M between the second and third voltage levels VL21 and VL31 may start later than the first eye EYE_H, and a third eye EYE_L between the third and fourth voltage levels VL31 and VL41 may start later than the second eye EYE_M. As such, when the eyes EYE_H, EYE_M and EYE_L are mis-aligned, the eye opening OP between the eyes EYE_H, EYE_M and EYE_L may be mis-aligned, and thus the characteristics with respect to the eye width W may be degraded. Therefore, it is necessary to match positions and/or starting points of the eyes EYE_H, EYE_M and EYE_L.

Figure 13B:
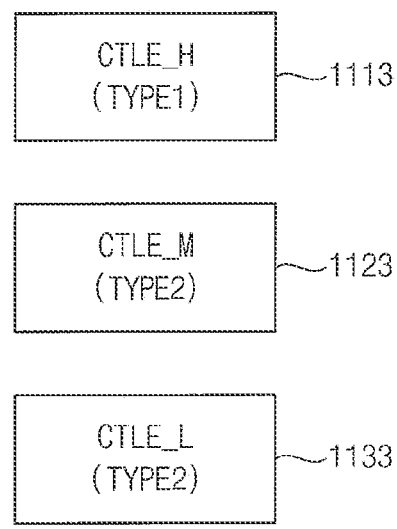

Referring to FIG. 13B, an example of continuous time linear equalizers included in the receiver of FIG. 3 is illustrated.

A first continuous time linear equalizer (CTLE_H) 1113, a second continuous time linear equalizer (CTLE_M) 1123 and a third continuous time linear equalizer (CTLE_L) 1133 may correspond to the first pre-amplifier 1110, the second pre-amplifier 1120 and the third pre-amplifier 1130 in FIG. 3, respectively. For example, the first continuous time linear equalizer 1113 may be included in the first pre-amplifier 1110, the second continuous time linear equalizer 1123 may be included in the second pre-amplifier 1120 and the third continuous time linear equalizer 1133 may be included in the third pre-amplifier 1130. A continuous time linear equalizer may be used to recover data lost due to channel loss.

The first continuous time linear equalizer 1113 may be implemented as a first type TYPE1, and each of the second and third continuous time linear equalizers 1123 and 1133 may be implemented as a second type TYPE2 different from the first type TYPE1. For example, the second type TYPE2 may represent an original structure of an original continuous time linear equalizer included in an original receiver, and the first type TYPE1 may represent a first modified structure of a continuous time linear equalizer, which is at least partially changed from the second type TYPE2. In other words, the first continuous time linear equalizer 1113 may correspond to the first circuit 1102 having the first structure in FIG. 1, and the second and third continuous time linear equalizers 1123 and 1133 may correspond to the second circuit 1104 having the second structure in FIG. 1.

The first continuous time linear equalizer 1113 of the first type TYPE1 and the second and third continuous time linear equalizers 1123 and 1133 of the second type TYPE2 may perform the same function and/or operation and may have different structures. For example, when the input data signal DS1 having the same voltage level (e.g., the first voltage level VL11) and the same reference voltage (e.g., the first reference voltage VREF_H) are input to the first continuous time linear equalizer 1113 of the first type TYPE1 and the second continuous time linear equalizer 1123 of the second type TYPE2, a starting point of an eye by the first continuous time linear equalizer 1113 and a starting point of an eye by the second continuous time linear equalizer 1123 may be different from each other. For example, an operating speed of the first continuous time linear equalizer 1113 may be slower than an operating speed of the second continuous time linear equalizer 1123, and the starting point of the eye by the first continuous time linear equalizer 1113 may be later than the starting point of the eye by the second continuous time linear equalizer 1123.

In an example of FIG. 13B, a structure of the first continuous time linear equalizer 1113 to which a relatively high voltage level is input may be modified or changed. When the input voltage level is relatively high, more current may flow through the continuous time linear equalizer, and the continuous time linear equalizer may have a relatively high operating speed. Therefore, the structure of the continuous time linear equalizer may be modified so that less current flows through the continuous time linear equalizer.

Figure 13C:
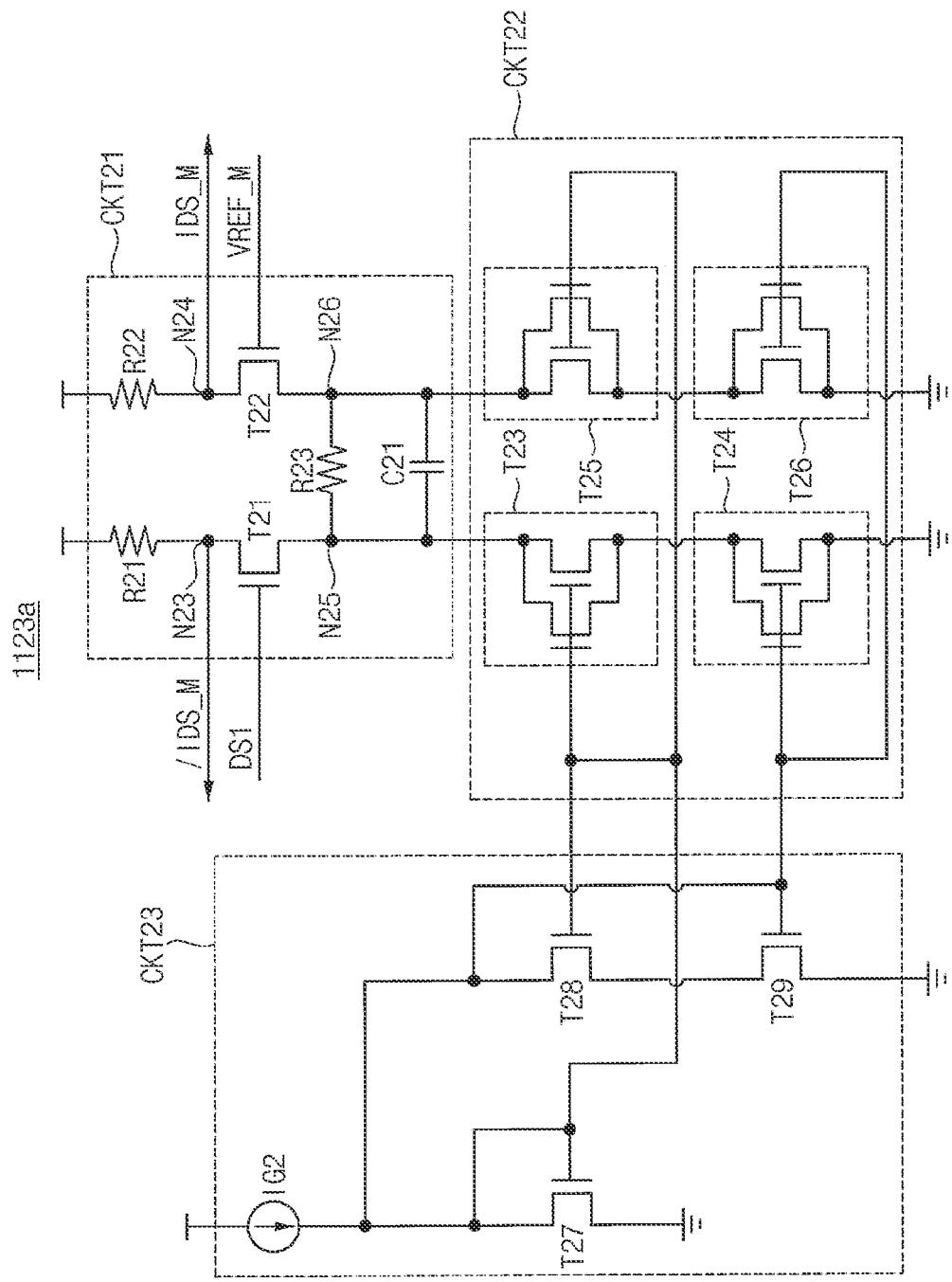

Referring to FIG. 13C, an example of the second continuous time linear equalizer in FIG. 13B is illustrated.

A second continuous time linear equalizer 1123a may include a first sub circuit CKT21, a second sub circuit CKT22 and a third sub circuit CKT23. The second continuous time linear equalizer 1123 of FIG. 13B may be implemented by the second continuous time linear equalizer 1123a.

The first sub circuit CKT21 may receive the input data signal DS1 and the second reference voltage VREF_M, may generate the second intermediate data signal IDS_M and the inverted second intermediate data signal /IDS_M based on the input data signal DS1 and the second reference voltage VREF_M, and may output the second intermediate data signal IDS_M and the inverted second intermediate data signal /IDS_M. The first sub circuit CKT21 may include resistors R21, R22 and R23, transistors T21 and T22, and a capacitor C21.

The resistor R21 may be connected between the power supply voltage and a node N23, and the resistor R22 may be connected between the power supply voltage and a node N24. The inverted second intermediate data signal /IDS_M may be output through the node N23, and the second intermediate data signal IDS_M may be output through the node N24. The transistor T21 may be connected between the node N23 and a node N25, and may have a gate electrode receiving the input data signal DS1. The transistor T22 may be connected between the node N24 and a node N26, and may have a gate electrode receiving the second reference voltage VREF_M. The resistor R23 and the capacitor C21 may be connected in parallel between the node N25 and the node N26.

The second sub circuit CKT22 may be connected to the first sub circuit CKT21 through the nodes N25 and N26, and may provide a driving current for generating the second intermediate data signal IDS_M and the inverted second intermediate data signal /IDS_M. For example, the second sub circuit CKT22 may operate as a current source that supplies the driving current to the second continuous time linear equalizer 1123a by replicating or mirroring a bias current. The second sub circuit CKT22 may include transistors T23, T24, T25 and T26.

The transistors T23 and the transistors T24 may be connected in series between the node N25 and the ground voltage. The transistors T25 and the transistors T26 may be connected in series between the node N26 and the ground voltage. The transistors T23 may be connected to each other in parallel, the transistors T24 may be connected to each other in parallel, the transistors T25 may be connected to each other in parallel, and the transistors T26 may be connected to each other in parallel. Gate electrodes of the transistors T23 and gate electrodes of the transistors T25 may be connected to each other, and gate electrodes of the transistors T24 and gate electrodes of the transistors T26 may be connected to each other.

The third sub circuit CKT23 may be connected to the second sub circuit CKT22, and may generate the bias current for generating the driving current. The third sub circuit CKT23 may be referred to as a bias circuit. The third sub circuit CKT23 may include a bias current source IG2 and transistors T27, T28 and T29.

The bias current source IG2 may be connected to the power supply voltage. The transistor T27 may be connected between the bias current source IG2 and the ground voltage, and may have a gate electrode connected to the gate electrodes of the transistors T23 and T25. The transistors T28 and T29 may be connected in series between the bias current source IG2 and the ground voltage. The transistor T28 may have a gate electrode connected to the gate electrodes of the transistors T23 and T25, and the transistor T29 may have a gate electrode connected to the gate electrodes of the transistors T24 and T26.

In some example embodiments, sizes and/or channel widths of the transistors T23, T24, T25 and T26 may be greater than sizes and/or channel widths of the transistors T27, T28 and T29. For example, when the sizes and/or channel widths of the transistors T27, T28 and T29 is about 10 μm and the sizes and/or channel widths of the transistors T23, T24, T25 and T26 is about 50 μm, the amount of the driving current may be about 5 times greater than that of the bias current. The amount of the driving current may be controlled or adjusted by changing the sizes and/or channel widths of the transistors T23, T24, T25 and T26.

Although not illustrated in detail, the third continuous time linear equalizer 1133 may have a structure substantially the same as that of the second continuous time linear equalizer 1123a, except that the second reference voltage VREF_M, the second intermediate data signal IDS_M and the inverted second intermediate data signal /IDS_M in FIG. 13C are replaced with the third reference voltage VREF_L, the third intermediate data signal IDS_L and the inverted third intermediate data signal /IDS_L, respectively.

Figure 13D:
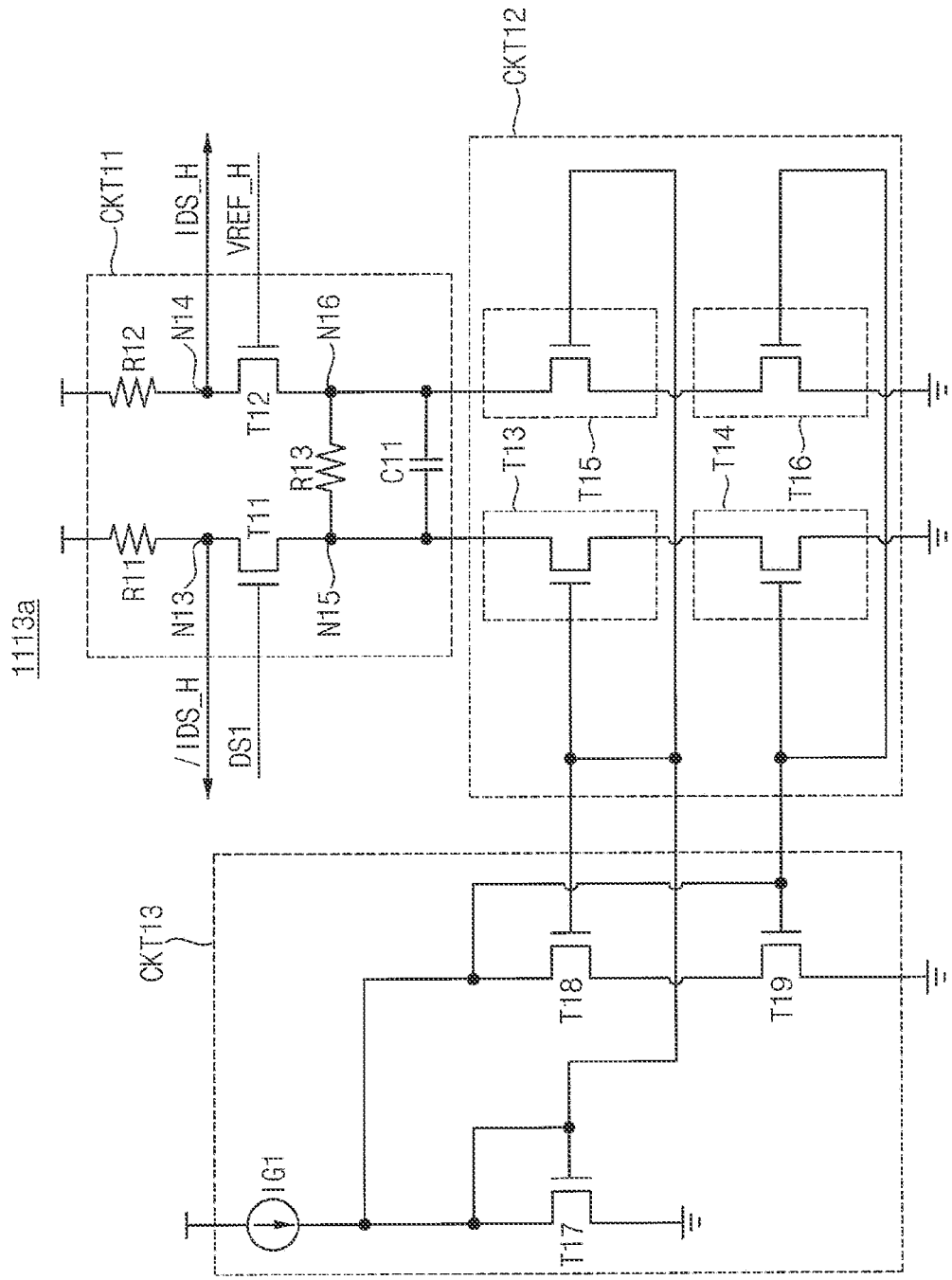

Referring to FIG. 13D, an example of the first continuous time linear equalizer in FIG. 13B is illustrated. The descriptions repeated with FIG. 13C will be omitted.

A first continuous time linear equalizer 1113a may include a first sub circuit CKT11, a second sub circuit CKT12 and a third sub circuit CKT13. The first continuous time linear equalizer 1113 of FIG. 13B may be implemented by the first continuous time linear equalizer 1113a. A structure of the first continuous time linear equalizer 1113a may be substantially the same as that of the second continuous time linear equalizer 1123a of FIG. 13C, except that the second sub circuit CKT12 is changed.

The first sub circuit CKT11 may receive the input data signal DS1 and the first reference voltage VREF_H, may generate the first intermediate data signal IDS_H and the inverted first intermediate data signal /IDS_H based on the input data signal DS1 and the first reference voltage VREF_H, and may output the first intermediate data signal IDS_H and the inverted first intermediate data signal /IDS_H. The first sub circuit CKT11 may include resistors R11, R12 and R13, transistors T11 and T12, and a capacitor C11 that are connected to each other through nodes N13, N14, N15 and N16.

The second sub circuit CKT12 may be connected to the sub circuit CKT11 through the nodes N15 and N16, and may provide a driving current for generating the first intermediate data signal IDS_H and the inverted first intermediate data signal /IDS_H. The second sub circuit CKT12 may include transistors T13, T14, T15 and T16.

The third sub circuit CKT13 may be connected to the second sub circuit CKT12, and may generate a bias current for generating the driving current. The third sub circuit CKT13 may include a bias current source IG1 and transistors T17, T18 and T19.

The number of the transistor T13, the number of the transistor T14, the number of the transistor T15, and the number of the transistor T16 included in the second sub circuit CKT12 of the first continuous time linear equalizer 1113a may be less than the number of the transistors T23, the number of the transistors T24, the number of the transistors T25, and the number of the transistors T26 included in the second sub circuit CKT22 of the second continuous time linear equalizer 1123a. For example, the number of the transistor T13, the number of the transistor T14, the number of the transistor T15, and the number of the transistor T16 may be one, respectively, and the number of the transistors T23, the number of the transistors T24, the number of the transistors T25, and the number of the transistors T26 may be two, respectively. However, example embodiments are not limited thereto.

As compared with the second continuous time linear equalizer 1123a, the number of the transistor T13, the number of the transistor T14, the number of the transistor T15, and the number of the transistor T16 included in the first continuous time linear equalizer 1113a may decrease, and the driving current of the first continuous time linear equalizer 1113a may decrease. Accordingly, an operating speed of the first continuous time linear equalizer 1113a may be slower than an operating speed of the second continuous time linear equalizer 1123a, and a starting point of an eye by the first continuous time linear equalizer 1113a may be later than a starting point of an eye by the second continuous time linear equalizer 1123a.

Although FIG. 13D illustrates an example where the number of the transistors T13, T14, T15 and T16 are changed (e.g., decreased), example embodiments are not limited thereto. For example, sizes and/or channel widths of the transistors T13, T14, T15 and T16 may be changed, and the driving voltage may decrease when the sizes and/or channel widths of the transistors T13, T14, T15 and T16 decreases.

Figure 13E:
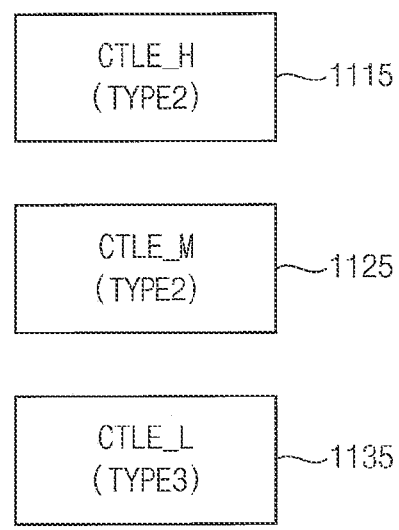

Referring to FIG. 13E, another example of continuous time linear equalizers included in the receiver of FIG. 3 is illustrated. The descriptions repeated with FIG. 13B will be omitted.

A first continuous time linear equalizer 1115, a second continuous time linear equalizer 1125 and a third continuous time linear equalizer 1135 may correspond to the first pre-amplifier 1110, the second pre-amplifier 1120 and the third pre-amplifier 1130 in FIG. 3, respectively. For example, the first pre-amplifier 1110 may include the first continuous time linear equalizer 1115, the second pre-amplifier 1120 may include the second continuous time linear equalizer 1125, and the third pre-amplifier 1130 may include the third continuous time linear equalizer 1135.

The third continuous time linear equalizer 1135 may be implemented as a third type TYPE3 different from the first type TYPE1 and the second type TYPE2, and each of the first and second continuous time linear equalizers 1115 and 1125 may be implemented as the second type TYPE2. For example, the third type TYPE3 may represent a second modified structure of a continuous time linear equalizer, which is at least partially changed from the second type TYPE2. In other words, the third continuous time linear equalizer 1135 may correspond to the first circuit 1102 having the first structure in FIG. 1, and the first and second continuous time linear equalizers 1115 and 1125 may correspond to the second circuit 1104 having the second structure in FIG. 1.

A structure of the second continuous time linear equalizer 1125 of the second type TYPE2 may be substantially the same as that of the second continuous time linear equalizer 1123 described with reference to FIGS. 13B and 13C. A structure of the first continuous time linear equalizer 1115 of the second type TYPE2 may be substantially the same as that of the second continuous time linear equalizer 1125.

The third continuous time linear equalizer 1135 of the third type TYPE3 and the first and second continuous time linear equalizers 1115 and 1125 of the second type TYPE2 may perform the same function and/or operation and may have different structures. For example, when the input data signal DS1 having the same voltage level and the same reference voltage are input to the second continuous time linear equalizer 1125 of the second type TYPE2 and the third continuous time linear equalizer and 1135 of the third type TYPE3, a starting point of an eye by the third continuous time linear equalizer 1135 and a starting point of an eye by the second continuous time linear equalizer 1125 may be different from each other. For example, an operating speed of the third continuous time linear equalizer 1135 may be faster than an operating speed of the second continuous time linear equalizer 1125, and the starting point of the eye by the third continuous time linear equalizer 1135 may precede the starting point of the eye by the second continuous time linear equalizer 1125.

In an example of FIG. 13E, a structure of the third continuous time linear equalizer 1135 to which a relatively low voltage level is input may be modified or changed. When the input voltage level is relatively low, less current may flow through the continuous time linear equalizer, and the continuous time linear equalizer may have a relatively low operating speed. Therefore, the structure of the continuous time linear equalizer may be modified so that more current flows through the continuous time linear equalizer.

Figure 13F:
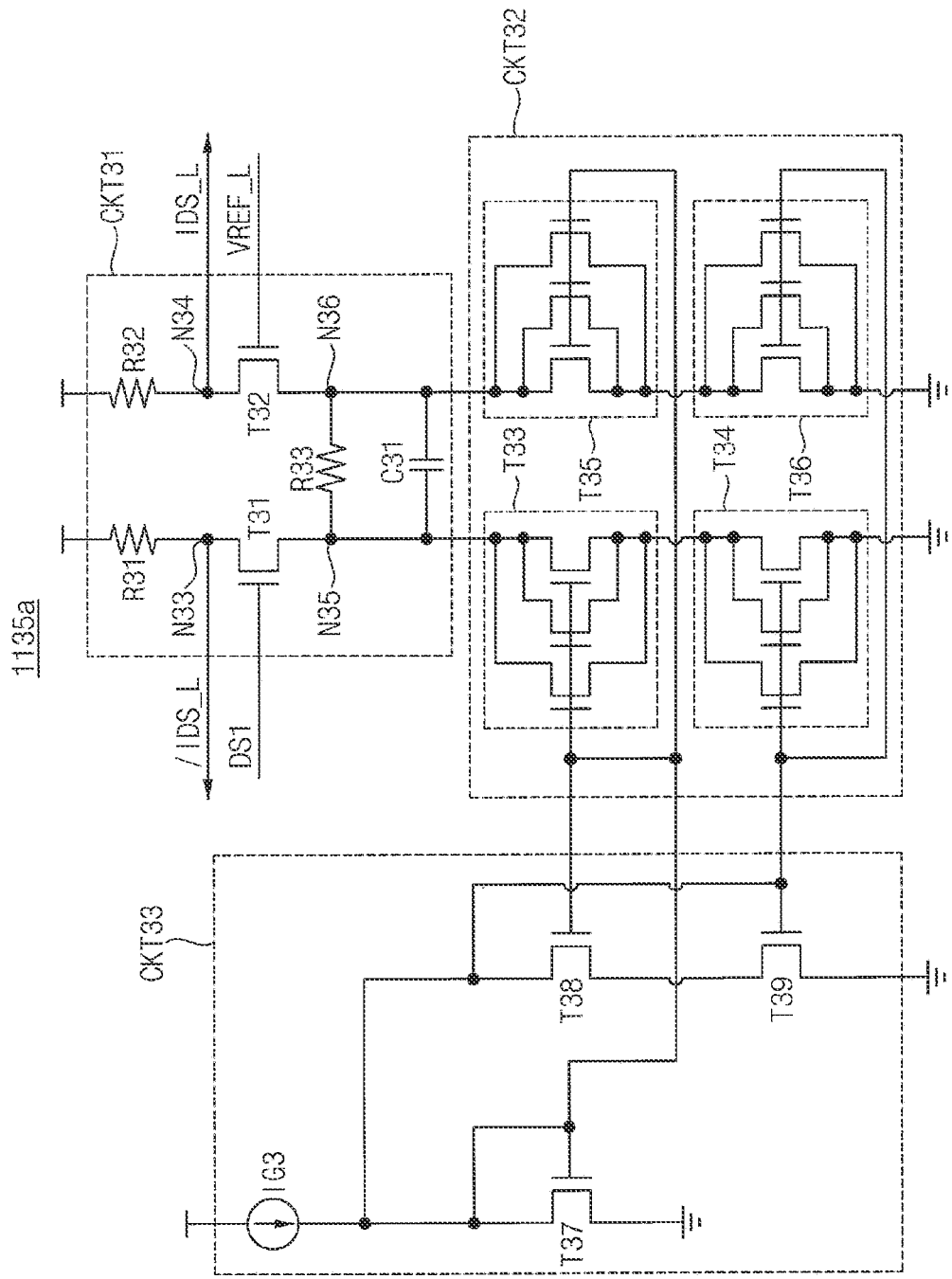

Referring to FIG. 13F, an example of the third continuous time linear equalizer in FIG. 13E is illustrated. The descriptions repeated with FIG. 13C will be omitted.

A third continuous time linear equalizer 1135a may include a first sub circuit CKT31, a second sub circuit CKT32 and a third sub circuit CKT33. The third continuous time linear equalizer 1135 of FIG. 13E may be implemented by the third continuous time linear equalizer 1135a. A structure of the third continuous time linear equalizer 1135a may be substantially the same as that of the second continuous time linear equalizer 1123a of FIG. 13C, except that the second sub circuit CKT32 is changed.

The first sub circuit CKT31 may receive the input data signal DS1 and the third reference voltage VREF_L, may generate the third intermediate data signal IDS_L and the inverted third intermediate data signal /IDS_L based on the input data signal DS1 and the third reference voltage VREF_L, and may output the third intermediate data signal IDS_L and the inverted third intermediate data signal /IDS_L. The first sub circuit CKT31 may include resistors R31, R32 and R33, transistors T31 and T32, and a capacitor C31 that are connected to each other through nodes N33, N34, N35 and N36.

The second sub circuit CKT32 may be connected to the first sub circuit CKT31 through the nodes N35 and N36, and may provide a driving current for generating the third intermediate data signal IDS_L and the third inverted intermediate data signal /IDS_L. The second sub circuit CKT32 may include transistors T33, T34, T35 and T36.

The third sub circuit CKT33 may be connected to the second sub circuit CKT32, and may generate a bias current for generating the driving current. The third sub circuit CKT33 may include a bias current source IG3 and transistors T37, T38 and T39.

The number of the transistor T33, the number of the transistor T34, the number of the transistor T35, and the number of the transistor T36 included in the second sub circuit CKT32 of the third continuous time linear equalizer 1135a may be greater than the number of the transistors T23, the number of the transistors T24, the number of the transistors T25, and the number of the transistors T26 included in the second sub circuit CKT22 of the second continuous time linear equalizer 1123a. For example, the number of the transistor T33, the number of the transistor T34, the number of the transistor T35, and the number of the transistor T36 may be three, respectively, and the number of the transistors T23, the number of the transistors T24, the number of the transistors T25, and the number of the transistors T26 may be two, respectively. However, example embodiments are not limited thereto.

As compared with the second continuous time linear equalizer 1123a, the number of the transistor T33, the number of the transistor T34, the number of the transistor T35, and the number of the transistor T36 included in the third continuous time linear equalizer 1135a may increase, and the driving current of the third continuous time linear equalizer 1135a may increase. Accordingly, an operation speed of the third continuous time linear equalizer 1135a may be faster than the operation speed of the second continuous-time linear equalizer 1123a, and a starting point of an eye by the third continuous time linear equalizer 1135a may precede the starting point of the eye by the second continuous time linear equalizer 1123a.

Although FIG. 13F illustrates an example where the number of the transistors T33, T34, T35 and T36 are changed (e.g., increased), example embodiments are not limited thereto. For example, sizes and/or channel widths of the transistors T33, T34, T35 and T36 may be changed, and the driving voltage may increase when the sizes and/or channel widths of the transistors T33, T34, T35 and T36 increases.

Figure 13G:
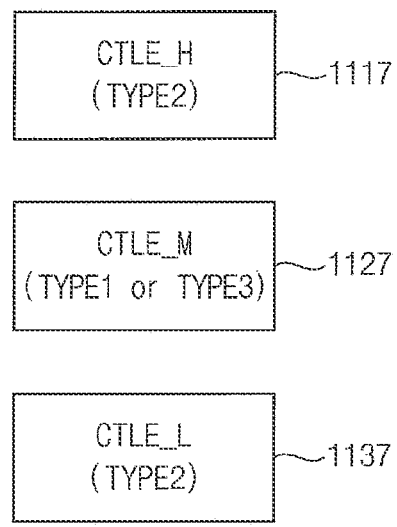
Figure 13H:
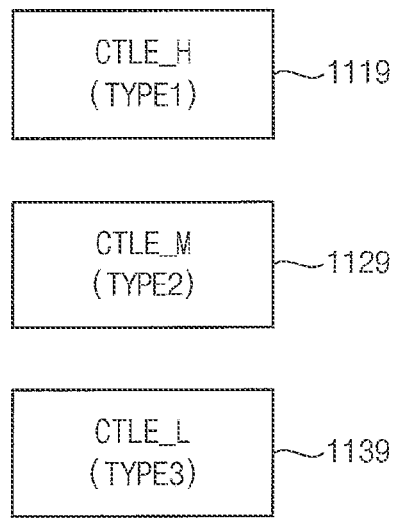

Referring to FIGS. 13G and 13H, other examples of continuous time linear equalizers included in the receiver of FIG. 3 is illustrated. The descriptions repeated with FIGS. 13B and 13E will be omitted.

In an example of FIG. 13G, a first continuous time linear equalizer 1117, a second continuous time linear equalizer 1127 and a third continuous time linear equalizer 1137 may correspond to the first pre-amplifier 1110, the second pre-amplifier 1120 and the third pre-amplifier 1130 in FIG. 3, respectively. For example, the first pre-amplifier 1110 may include the first continuous time linear equalizer 1117, the second pre-amplifier 1120 may include the second level shifter 1125, and the third pre-amplifier 1130 may include the third level shifter 1135.

The second continuous time linear equalizer 1127 may be implemented as the first type TYPE1 or the third type TYPE3, and each of the first and third continuous time linear equalizers 1117 and 1137 may be implemented as the second type TYPE2. In other words, the second continuous time linear equalizer 1127 may correspond to the first circuit 1102 having the first structure in FIG. 1, and the first and third continuous time linear equalizers 1117 and 1137 may correspond to the second circuit 1104 having the second structure in FIG. 1.

A structure of the first continuous time linear equalizer 1117 and a structure of the third continuous time linear equalizer 1137 may be substantially the same as that of the first continuous time linear equalizer 1115 in FIG. 13E and that of the third continuous time linear equalizer 1133 in FIG. 13B, respectively. The second continuous time linear equalizer 1127 may have a structure substantially the same as that described with reference to FIGS. 13B and 13D, or a structure substantially the same as that described with reference to FIGS. 13E and 13F.

In the example of FIG. 13G, the structure of the second continuous time linear equalizer 1127 may be modified or changed.

In an example of FIG. 13H, a first continuous time linear equalizer 1119, a second continuous time linear equalizer 1129 and a third continuous time linear equalizer 1139 may correspond to the first pre-amplifier 1110, the second pre-amplifier 1120 and the third pre-amplifier 1130 in FIG. 3, respectively. For example, the first continuous time linear equalizer 1119 may be included in the first pre-amplifier 1110, the second continuous time linear equalizer 1129 may be included in the second pre-amplifier 1120 and the third continuous time linear equalizer 1139 may be included in the third pre-amplifier 1130.

The first continuous time linear equalizer 1119 may be implemented as the first type TYPE1, the second continuous time linear equalizer 1129 may be implemented as the second type TYPE2, and the third continuous time linear equalizer 1139 may be implemented as the third type TYPE3. In other words, the pre-amplifier circuit 1100 in FIG. 1 may further include a third circuit having a third structure different from the first and second structures, the first continuous time linear equalizer 1119 may correspond to the first circuit 1102 having the first structure in FIG. 1, the second continuous time linear equalizer 1129 may correspond to the second circuit 1104 having the second structure in FIG. 1, and the third continuous time linear equalizer 1139 may correspond to the third circuit having the third structure. A structure of the first continuous time linear equalizer 1119, a structure of the second continuous time linear equalizer 1129, and a structure of the third continuous time linear equalizer 1139 may be substantially the same as that of the first continuous time linear equalizer 1113 in FIG. 13B, that of the second continuous time linear equalizer 1123 in FIG. 13B, and that of the third continuous time linear equalizer 1135 in FIG. 13E, respectively.

In the example of FIG. 13H, both a structure of the first continuous time linear equalizer 1119 to which a relatively high voltage level is input and a structure of the third continuous time linear equalizer 1139 to which a relatively low voltage level is input may be modified or changed.

Although example embodiments are described based on the level shifters and the continuous time linear equalizers, example embodiments are not limited thereto.

Figure 14:
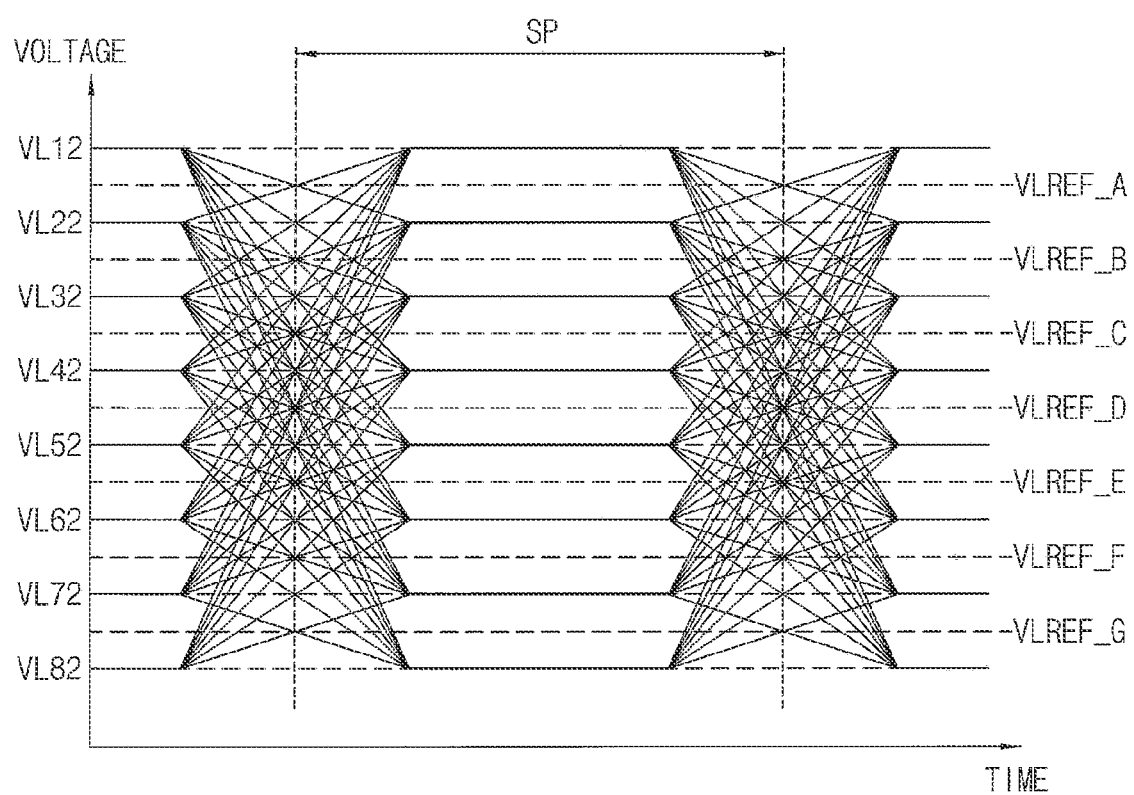
FIG. 14 is a diagram for describing a data signal that is input to a receiver according to example embodiments.

FIG. 14 is a diagram for describing a data signal that is input to a receiver according to an example embodiment. FIG. 14 is a diagram illustrated by simplifying an ideal eye diagram of a data signal (e.g., a PAM8 signal) generated based on the 8-level scheme (e.g., the PAM8 scheme). The descriptions repeated with FIGS. 2A and 2B will be omitted.

Referring to FIG. 14, different first, second, third, fourth, fifth, sixth, seventh and eighth voltage levels VL12, VL22, VL32, VL42, VL52, VL62, VL72 and VL82 of the data signal that is the PAM8 signal are illustrated, and different first, second, third, fourth, fifth, sixth and seventh reference levels VLREF_A, VLREF_B, VLREF_C, VLREF_D, VLREF_E, VLREF_F_and VLREF_G for sensing or detecting the level of the data signal are illustrated.

Figure 15:
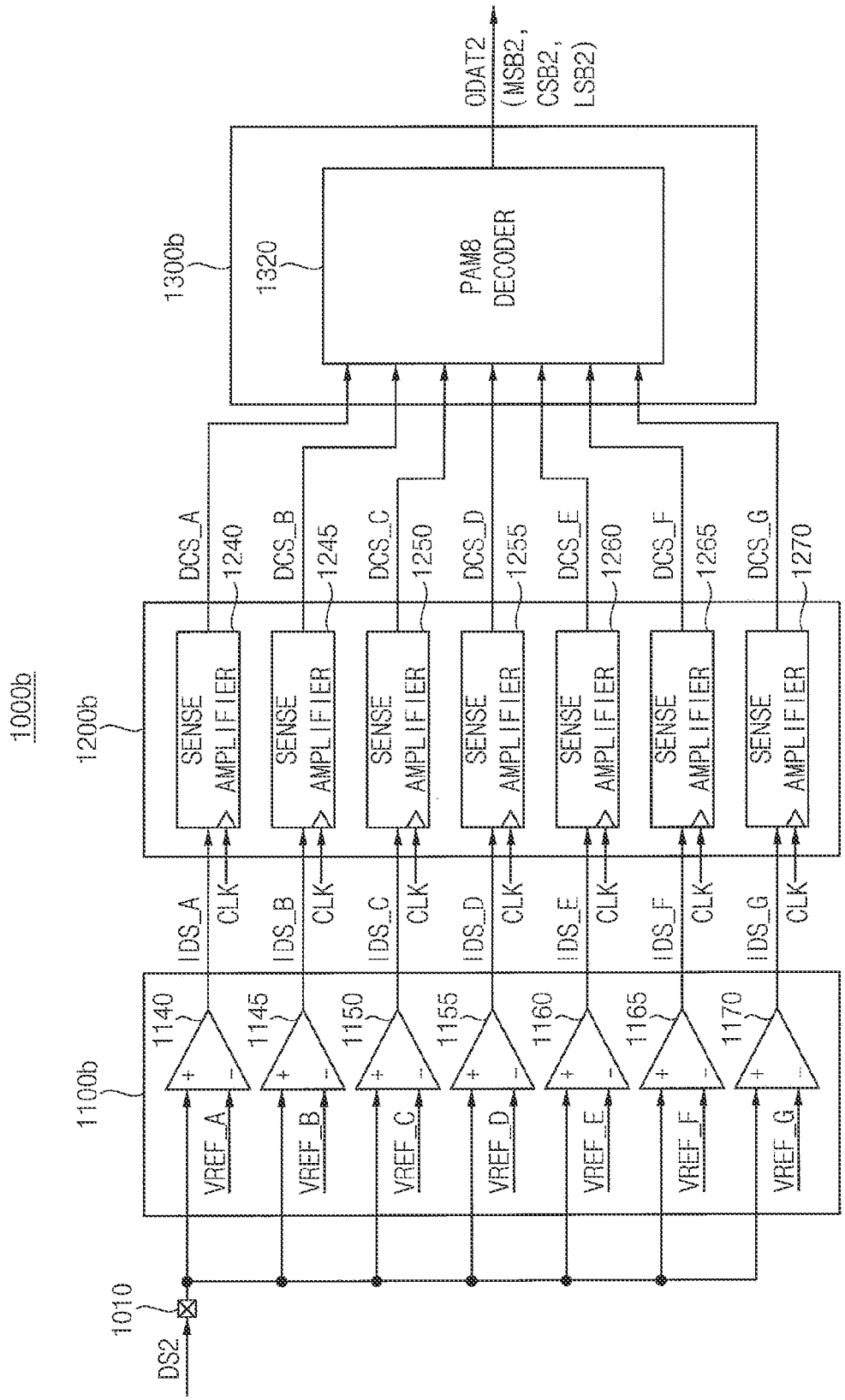
FIG. 15 is a block diagram illustrating another example of a receiver of FIG. 1.

FIG. 15 is a block diagram illustrating an example of a receiver of FIG. 1. The descriptions repeated with FIG. 3 will be omitted.

Referring to FIG. 15, a receiver 1000*b* includes a pre-amplifier circuit 1100*b*, a slicer circuit 1200*b* and a decoder circuit 1300*b*. The receiver 1000 of FIG. 1 may be implemented by the receiver 1000*b*. The receiver 1000*b* may further include a data input pad 1010. For example, the receiver 1000*b* may be a PAM8 receiver that receives an input data signal DS2 that is generated based on the PAM8 scheme and/or is the PAM8 signal.

The data input pad 1010 may receive the input data signal DS2 having one of the first, second, third, fourth, fifth, sixth, seventh and eighth voltage levels VL12, VL22, VL32, VL42, VL52, VL62, VL72 and VL82 in FIG. 14 during one unit interval.

The pre-amplifier circuit 1100*b* may include a first pre-amplifier 1140, a second pre-amplifier 1145, a third pre-amplifier 1150, a fourth pre-amplifier 1155, a fifth pre-amplifier 1160, a sixth pre-amplifier 1165 and a seventh pre-amplifier 1170. The slicer circuit 1200*b* may include a first sense amplifier 1240, a second sense amplifier 1245, a third sense amplifier 1250, a fourth sense amplifier 1255, a fifth sense amplifier 1260, a sixth sense amplifier 1265 and a seventh sense amplifier 1270. The decoder circuit 1300*b* may include a PAM8 decoder 1320.

As described with reference to FIG. 3, each of the first, second, third, fourth, fifth, sixth and seventh pre-amplifiers 1140, 1145, 1150, 1155, 1160, 1165 and 1170 may include a level shifter or a continuous time linear equalizer. Each of the first, second, third, fourth, fifth, sixth and seventh pre-amplifiers 1140, 1145, 1150, 1155, 1160, 1165 and 1170 may generate a respective one of first, second, third, fourth, fifth, sixth and seventh intermediate data signals IDS_A, IDS_B, IDS_C, IDS_D, IDS_E, IDS_F and IDS_G based on the input data signal DS2 and a respective one of first, second, third, fourth, fifth, sixth and seventh reference voltages VREF_A, VREF_B, VREF_C, VREF_D, VREF_E, VREF_F and VREF_G. For example, the first, second, third, fourth, fifth, sixth and seventh reference voltages VREF_A, VREF_B, VREF_C, VREF_D, VREF_E, VREF_F and VREF_G may have the first, second, third, fourth, fifth, sixth and seventh reference levels VLREF_A, VLREF_B, VLREF_C, VLREF_D, VLREF_E, VLREF_F_and VLREF_G in FIG. 14, respectively.

Each of the first, second, third, fourth, fifth, sixth and seventh sense amplifiers 1240, 1245, 1250, 1255, 1260, 1265 and 1270 may generate a respective one of first, second, third, fourth, fifth, sixth and seventh decision signals DCS_A, DCS_B, DCS_C, DCS_D, DCS_E, DCS_F and DCS_G based on a respective one of the first, second, third, fourth, fifth, sixth and seventh intermediate data signals IDS_A, IDS_B, IDS_C, IDS_D, IDS_E, IDS_F and IDS_G and the clock signal CLK.

The PAM8 decoder 1320 may generate output data ODAT2 including a first bit MSB2, a second bit CSB2 and a third bit LSB2 based on the first, second, third, fourth, fifth, sixth and seventh decision signals DCS_A, DCS_B, DCS_C, DCS_D, DCS_E, DCS_F and DCS_G. The first, second and third bits MSB2, CSB2 and LSB2 may be an MSB, a central significant bit (CSB) and an LSB of the output data ODAT2, respectively.

FIGS. 16, 17, 18 and 19 are block diagrams illustrating examples of level shifters included in a receiver of FIG. 15.

Referring to FIGS. 16, 17, 18 and 19, each of first pre-amplifiers 1140*a*, 1140*b*, 1140*c* and 1140*d* may correspond to the first pre-amplifier 1140 in FIG. 15, and may include a first level shifter LS_A or a first continuous time linear equalizer CTLE_A. Each of second pre-amplifiers 1145*a*, 1145*b*, 1145*c* and 1145*d* may correspond to the second pre-amplifier 1145 in FIG. 15, and may include a second level shifter LS_B or a second continuous time linear equalizer CTLE_B. Each of third pre-amplifiers 1150*a*, 1150*b*, 1150*c* and 1150*d* may correspond to the third pre-amplifier 1150 in FIG. 15, and may include a third level shifter LS_C or a third continuous time linear equalizer CTLE_C. Each of fourth pre-amplifiers 1155*a*, 1155*b*, 1155*c* and 1155*d* may correspond to the fourth pre-amplifier 1155 in FIG. 15, and may include a fourth level shifter LS_D or a fourth continuous time linear equalizer CTLE_D. Each of fifth pre-amplifiers 1160*a*, 1160*b*, 1160*c* and 1160*d* may correspond to the fifth pre-amplifier 1160 in FIG. 15, and may include a fifth level shifter LS_E or a fifth continuous time linear equalizer CTLE_E. Each of sixth pre-amplifiers 1165*a*, 1165*b*, 1165*c* and 1165*d* may correspond to the sixth pre-amplifier 1165 in FIG. 15, and may include a sixth level shifter LS_F or a sixth continuous time linear equalizer CTLE_F. Each of seventh pre-amplifiers 1170*a*, 1170*b*, 1170*c* and 1170*d* may correspond to the seventh pre-amplifier 1170 in FIG. 15, and may include a seventh level shifter LS_G or a seventh continuous time linear equalizer CTLE_G.

Figure 16:
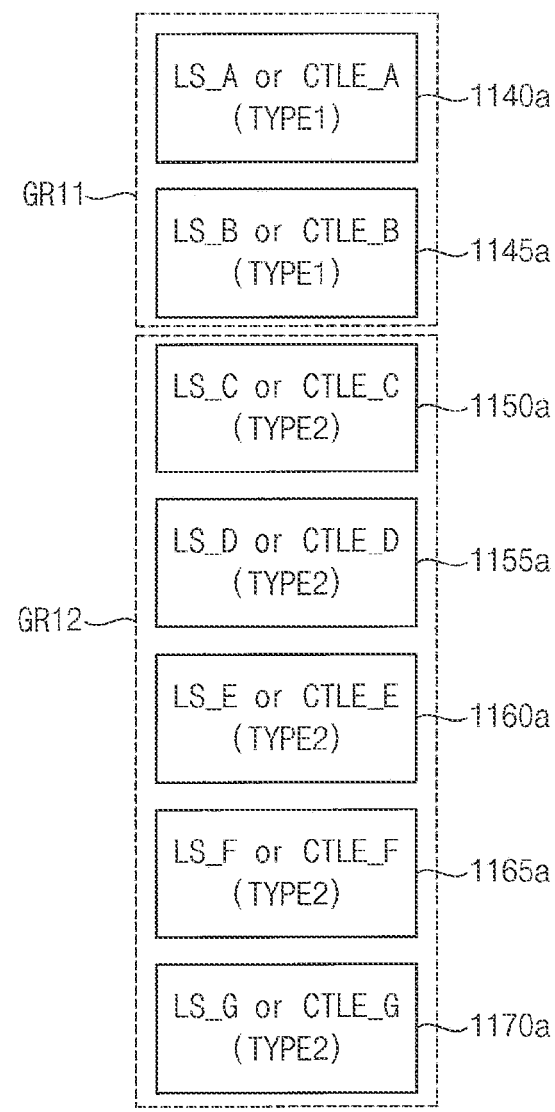
FIGS. 16, 17, 18 and 19 are block diagrams illustrating examples of level shifters included in a receiver of FIG. 15.

In an example embodiment, as illustrated in FIG. 16, the first and second pre-amplifiers 1140*a* and 1145*a* to which a relatively high voltage level is input may be categorized into a first group GR11, and the remaining third, fourth, fifth, sixth and seventh pre-amplifiers 1150*a*, 1155*a*, 1160*a*, 1165*a* and 1170*a* may be categorized into a second group GR12. The pre-amplifiers 1140*a* and 1145*a* included in the first group GR11 may be implemented as a first type TYPE1, and the pre-amplifiers 1150*a*, 1155*a*, 1160*a*, 1165*a* and 1170*a* included in the second group GR12 may be implemented as a second type TYPE2.

Figure 17:
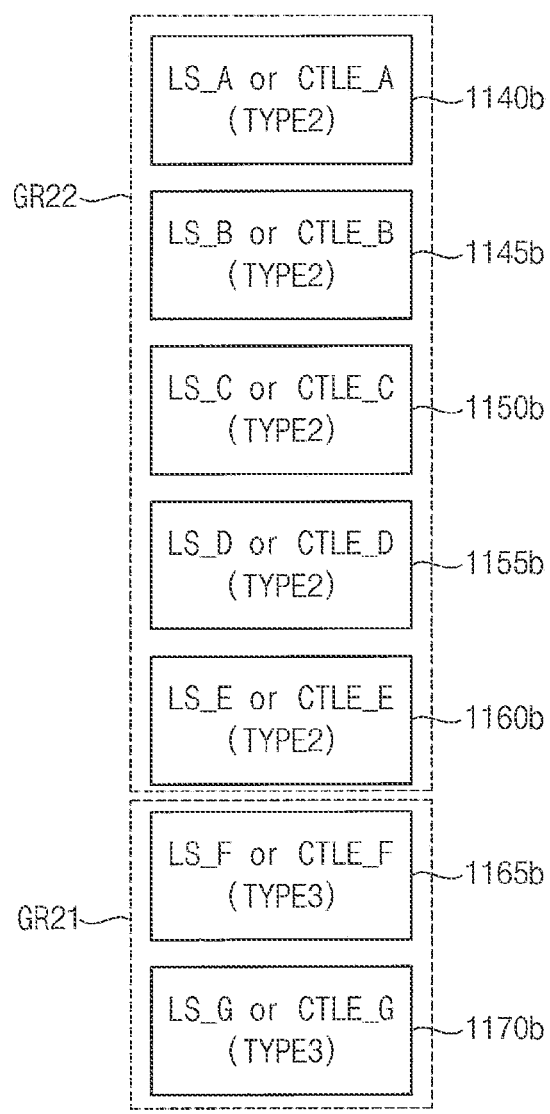

In an example embodiment, as illustrated in FIG. 17, the sixth and seventh pre-amplifiers 1165*b* and 1170*b* to which a relatively low voltage level is input may be categorized into a first group GR21, and the remaining first, second, third, fourth and fifth pre-amplifiers 1140*b*, 1145*b*, 1150*b*, 1155*b* and 1160*b* may be categorized into a second group GR22. The pre-amplifiers 1165*b* and 1170*b* included in the first group GR21 may be implemented as a third type TYPE3, and the pre-amplifiers 1140*b*, 1145*b*, 1150*b*, 1155*b* and 1160*b* included in the second group GR22 may be implemented as the second type TYPE2.

Figure 18:
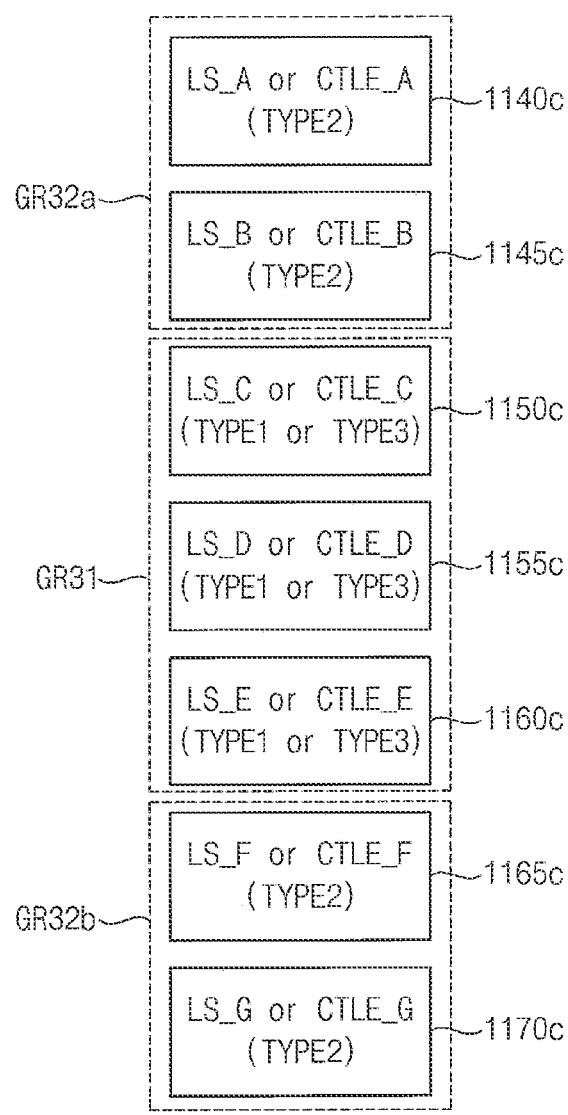

In an example embodiment, as illustrated in FIG. 18, the third, fourth and fifth pre-amplifiers 1150*c*, 1155*c* and 1160*c* to which a middle voltage level is input may be categorized into a first group GR31, the remaining first and second pre-amplifiers 1140*c*, 1145*c* may be categorized into one second group GR32*a*, and the remaining sixth and seventh pre-amplifiers 1165*c* and 1170*c* may be categorized into another second group GR32*b*. The pre-amplifiers 1150*c*, 1155*c* and 1160*c* included in the first group GR31 may be implemented as the first type TYPE1 or the third type TYPE3, and the pre-amplifiers 1140*c*, 1145*c*, 1165*c* and 1170*c* included in the second groups GR32*a* and GR32*b* may be implemented as the second type TYPE2.

Figure 19:
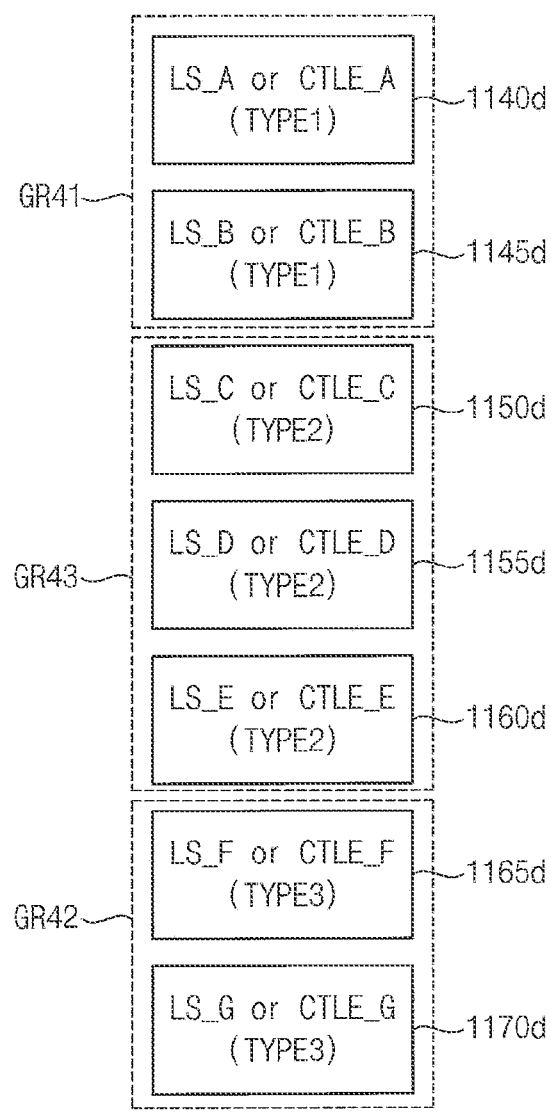

In an example embodiment, as illustrated in FIG. 19, the first and second pre-amplifiers 1140*d* and 1145*d* to which a relatively high voltage level is input may be categorized into a first group GR41, the sixth and seventh pre-amplifiers 1165*d* and 1170*d* to which a relatively low voltage level is input may be categorized into a second group GR42, and the remaining third, fourth and fifth pre-amplifiers 1150*d*, 1155*d* and 1160*d* may be categorized into a third group GR43. The pre-amplifiers 1140*d* and 1145*d* included in the first group GR41 may be implemented as the first type TYPE1, the pre-amplifiers 1165*d* and 1170*d* included in the second group GR42 may be implemented as the third type TYPE3, and the pre-amplifiers 1150*d*, 1155*d* and 1160*d* included in the third group GR43 may be implemented as the second type TYPE2.

Although FIGS. 16 through 19 illustrate the examples where seven pre-amplifiers are categorized into two or three groups and are implemented as two or three different types, example embodiments are not limited thereto. For example, seven pre-amplifiers may be categorized into four or more groups and may be implemented as four or more different types. For another example, all of seven preamplifiers may have different structures.

Although example embodiments are described based on the examples where the receiver includes the same number of pre-amplifiers as the plurality of reference voltages, example embodiments are not limited thereto. For example, the PAM4 receiver may include two pre-amplifiers, and the two pre-amplifiers may have different structures. In another example, the PAM8 receiver may include two or more but not more than six pre-amplifiers, and at least some of the pre-amplifiers may have different structures.

Figure 20:
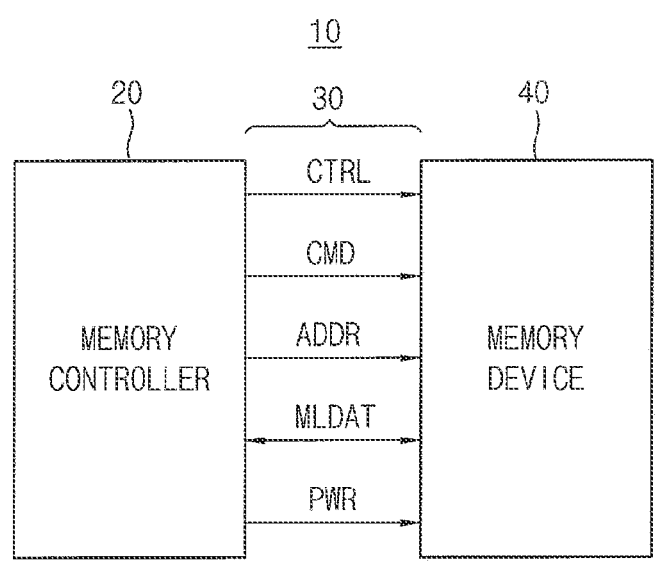
FIG. 20 is a block diagram illustrating a memory system according to an example embodiment.

FIG. 20 is a block diagram illustrating a memory system according to an example embodiment.

Referring to FIG. 20, a memory system 10 includes a memory controller 20 and a memory device 40. The memory system 10 may further include a plurality of signal lines 30 that electrically connect the memory controller 20 with the memory device 40.

The memory device 40 is controlled by the memory controller 20. For example, based on requests from a host (not illustrated), the memory controller 20 may store (e.g., write or program) data into the memory device 40, or may retrieve (e.g., read or sense) data from the memory device 40.

The plurality of signal lines 30 may include control lines, command lines, address lines, data input/output (I/O) lines and power lines. The memory controller 20 may transmit a command CMD, an address ADDR and a control signal CTRL to the memory device 40 via the command lines, the address lines and the control lines, may exchange a data signal MLDAT with the memory device 40 via the data I/O lines, and may transmit a power supply voltage PWR to the memory device 40 via the power lines. For example, the data signal MLDAT may be the multi-level signal that is received according to example embodiments. Although not illustrated in FIG. 20, the plurality of signal lines 30 may further include data strobe signal (DQS) lines for transmitting a DQS signal.

In an example embodiment, at least a part or all of the signal lines 30 may be referred to as a channel. The term "channel" as used herein may represent signal lines that include the data I/O lines for transmitting the data signal MLDAT. However, example embodiments are not limited thereto, and the channel may further include the command lines for transmitting the command CMD and/or the address lines for transmitting the address ADDR.

Figure 21A:
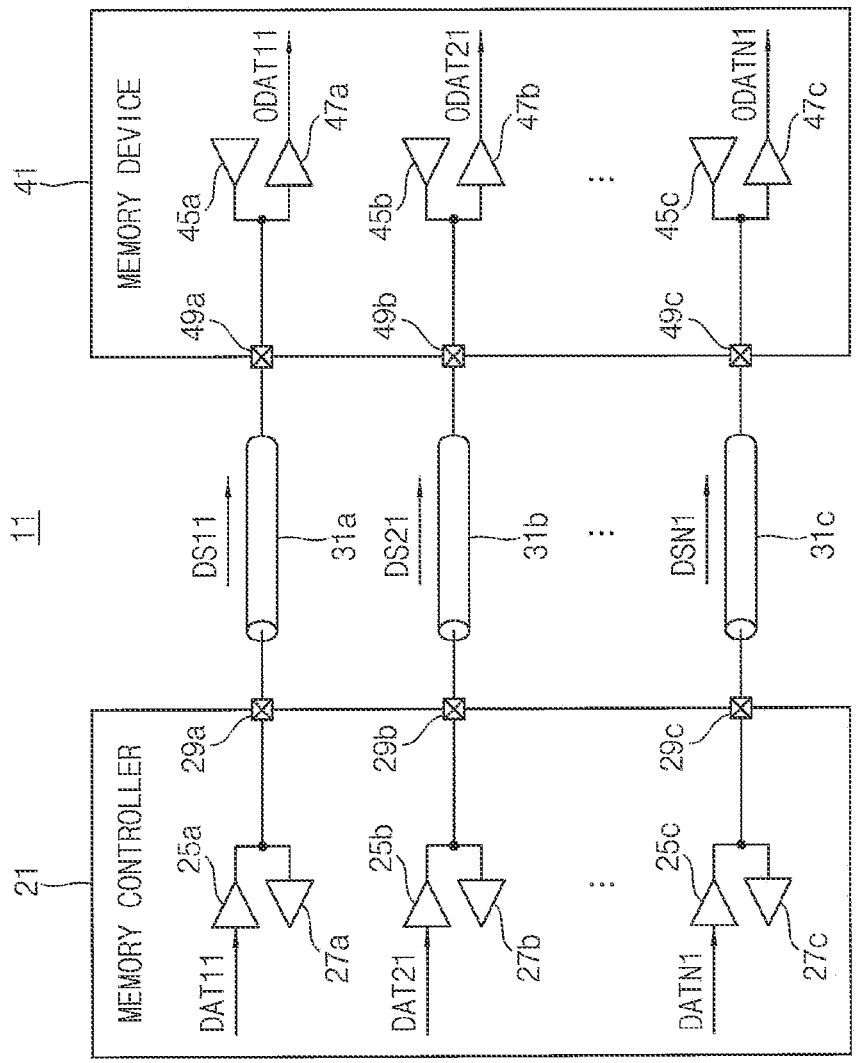
FIGS. 21A and 21B are block diagrams illustrating an example of a memory system of FIG. 20.
Figure 21B:
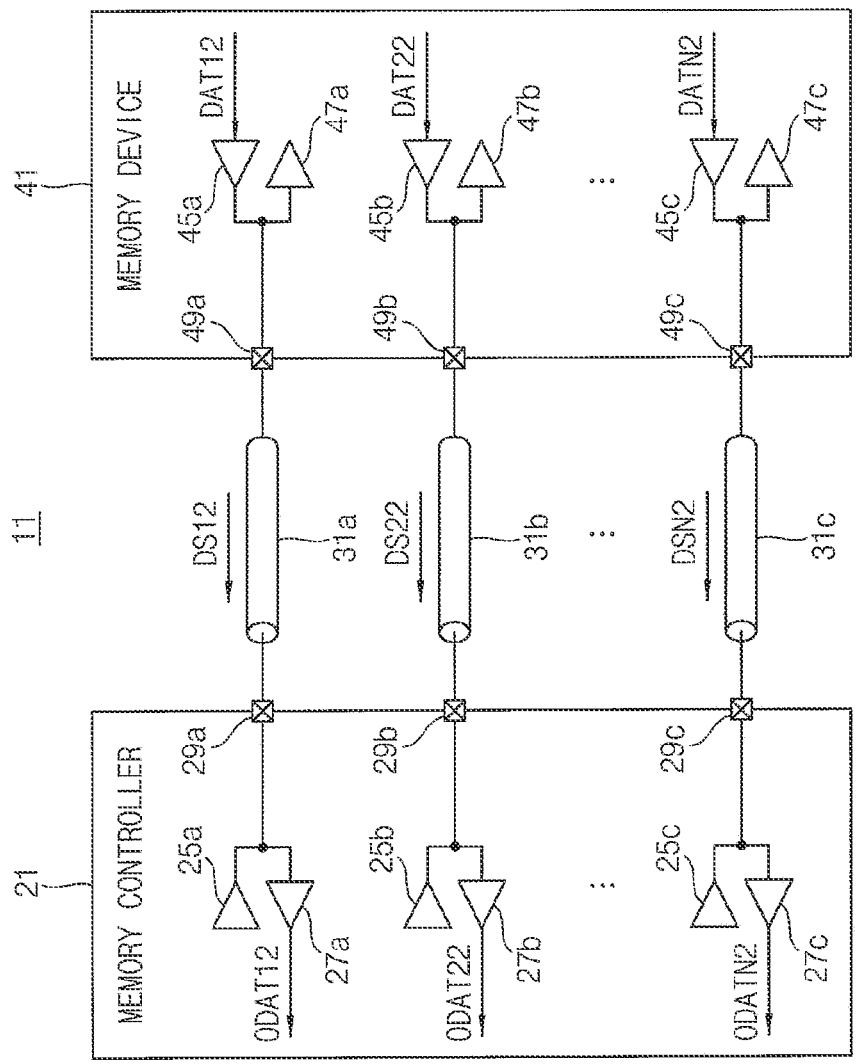

FIGS. 21A and 21B are block diagrams illustrating an example of a memory system of FIG. 20.

Referring to FIGS. 21A and 21B, a memory system 11 includes a memory controller 21, a memory device 41 and a plurality of channels 31a, 31b and 31c. For example, the number of the channels 31a, 31b and 31c may be N, where N is a natural number greater than or equal to two.

The memory controller 21 may include a plurality of transmitters 25a, 25b and 25c, a plurality of receivers 27a, 27b and 27c, and a plurality of data I/O pads 29a, 29b and 29c. The memory device 41 may include a plurality of transmitters 45a, 45b and 45c, a plurality of receivers 47a, 47b and 47c, and a plurality of data I/O pads 49a, 49b and 49c.

Each of the plurality of transmitters 25a, 25b, 25c, 45a, 45b and 45c may generate the multi-level signal. Each of the plurality of receivers 27a, 27b, 27c, 47a, 47b and 47c may receive the multi-level signal, and may be the receiver according to example embodiments. For example, each of the plurality of receivers 27a, 27b, 27c, 47a, 47b and 47c may be the receiver which is described with reference to FIGS. 1 through 19.

Each of the plurality of data I/O pads 29a, 29b, 29c, 49a, 49b and 49c may be connected to a respective one of the plurality of transmitters 25a, 25b, 25c, 45a, 45b and 45c and a respective one of the plurality of receivers 27a, 27b, 27c, 47a, 47b and 47c.

The plurality of channels 31a, 31b and 31c may connect the memory controller 21 with the memory device 41. Each of the plurality of channels 31a, 31b and 31c may be connected to a respective one of the plurality of transmitters 25a, 25b and 25c and a respective one of the plurality of receivers 27a, 27b and 27c through a respective one of the plurality of data I/O pads 29a, 29b and 29c. Similarly, each of the plurality of channels 31a, 31b and 31c may be connected to a respective one of the plurality of transmitters 45a, 45b and 45c and a respective one of the plurality of receivers 47a, 47b and 47c through a respective one of the plurality of data I/O pads 49a, 49b and 49c. The multi-level signal may be transmitted through each of the plurality of channels 31a, 31b and 31c.

FIG. 21A illustrates an operation of transferring data from the memory controller 21 to the memory device 41. For example, the transmitter 25a may generate a data signal DS11, which is the multi-level signal, based on input data DAT11, the data signal DS11 may be transmitted from the memory controller 21 to the memory device 41 through the channel 31a, and the receiver 47a may receive the data signal DS11 to obtain output data ODAT11 corresponding to the input data DAT11. Similarly, the transmitter 25b may generate a data signal DS21, which is the multi-level signal, based on input data DAT21, the data signal DS21 may be transmitted to the memory device 41 through the channel 31b, and the receiver 47b may receive the data signal DS21 to obtain output data ODAT21 corresponding to the input data DAT21. The transmitter 25c may generate a data signal DSN1, which is the multi-level signal, based on input data DATN1, the data signal DSN1 may be transmitted to the memory device 41 through the channel 31c, and the receiver 47c may receive the data signal DSN1 to obtain output data ODATN1 corresponding to the input data DATN1. For example, the input data DAT11, DAT21 and DATN1 may be write data to be stored into the memory device 41, and a write command and a write address for storing the write data may be provided to the memory device 41 together with the write data.

FIG. 21B illustrates an operation of transferring data from the memory device 41 to the memory controller 21. For example, the transmitter 45a may generate a data signal DS12, which is the multi-level signal, based on input data DAT12, the data signal DS12 may be transmitted from the memory device 41 to the memory controller 21 through the channel 31a, and the receiver 27a may receive the data signal DS12 to obtain output data ODAT12 corresponding to the input data DAT12. Similarly, the transmitter 45b may generate a data signal DS22, which is the multi-level signal, based on input data DAT22, the data signal DS22 may be transmitted to the memory controller 21 through the channel 31b, and the receiver 27b may receive the data signal DS22 to obtain output data ODAT22 corresponding to the input data DAT22. The transmitter 45c may generate a data signal DSN2, which is the multi-level signal, based on input data DATN2, the data signal DSN2 may be transmitted to the memory controller 21 through the channel 31c, and the receiver 27c may receive the data signal DSN2 to obtain output data ODATN2 corresponding to the input data DATN2. For example, the input data DAT12, DAT22 and DATN2 may be read data retrieved from the memory device 41, and a read command and a read address for retrieving the read data may be provided to the memory device 41.

Figure 22:
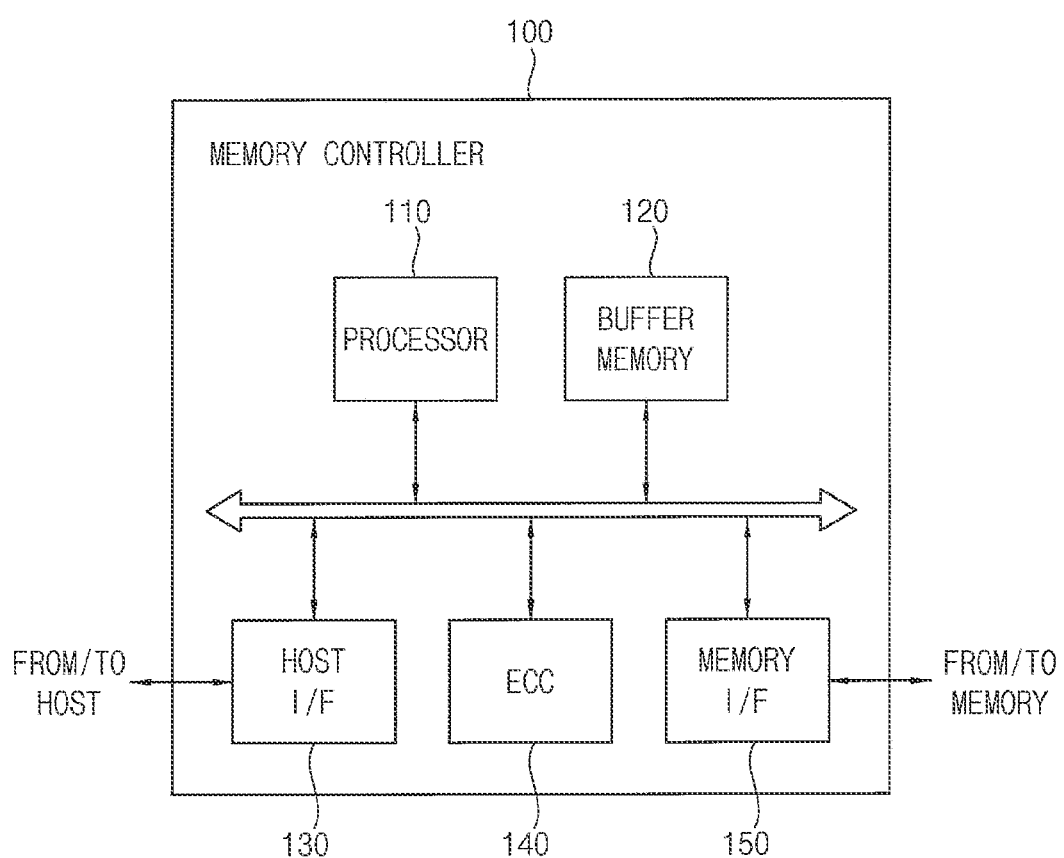
FIG. 22 is a block diagram illustrating an example of a memory controller included in a memory system according to an example embodiment.

FIG. 22 is a block diagram illustrating an example of a memory controller included in a memory system according to an example embodiment.

Referring to FIG. 22, a memory controller 100 may include at least one processor 110, a buffer memory 120, a host interface 130, an error correction code (ECC) block 140 and a memory interface 150.

The processor 110 may control an operation of the memory controller 100 in response to a command and/or request received via the host interface 130 from an external host (not illustrated). For example, the processor 110 may control respective components by employing firmware for operating a memory device (e.g., the memory device 40 in FIG. 20).

The buffer memory 120 may store instructions and data executed and processed by the processor 110. For example, the buffer memory 120 may be implemented with a volatile memory device such as a dynamic random access memory (DRAM), a static random access memory (SRAM), a cache memory, or the like.

The host interface 130 may provide physical connections between the host and the memory controller 100. The host interface 130 may provide an interface corresponding to a bus format of the host for communication between the host and the memory controller 100. In some example embodiments, the bus format of the host may be a small computer system interface (SCSI) or a serial attached SCSI (SAS) interface. In other example embodiments, the bus format of the host may be a universal serial bus (USB), a peripheral component interconnect (PCI) express (PCIe), an advanced technology attachment (ATA), a parallel ATA (PATA), a serial ATA (SATA), a nonvolatile memory (NVM) express (NVMe), etc., format.

The ECC block 140 for error correction may perform coded modulation using a Bose-Chaudhuri-Hocquenghem (BCH) code, a low density parity check (LDPC) code, a turbo code, a Reed-Solomon code, a convolution code, a recursive systematic code (RSC), a trellis-coded modulation (TCM), a block coded modulation (BCM), etc., or may perform ECC encoding and ECC decoding using above-described codes or other error correction codes.

The memory interface 150 may exchange data with the memory device. The memory interface 150 may transmit a command and an address to the memory device, and may transmit data to the memory device or receive data read from the memory device. Although not illustrated in FIG. 22, a transmitter (e.g., the transmitter 25a in FIG. 21A) that generates the multi-level signal and a receiver (e.g., the receiver 27a in FIG. 21A) that receives the multi-level signal according to example embodiments may be included in the memory interface 150.

Figure 23A:
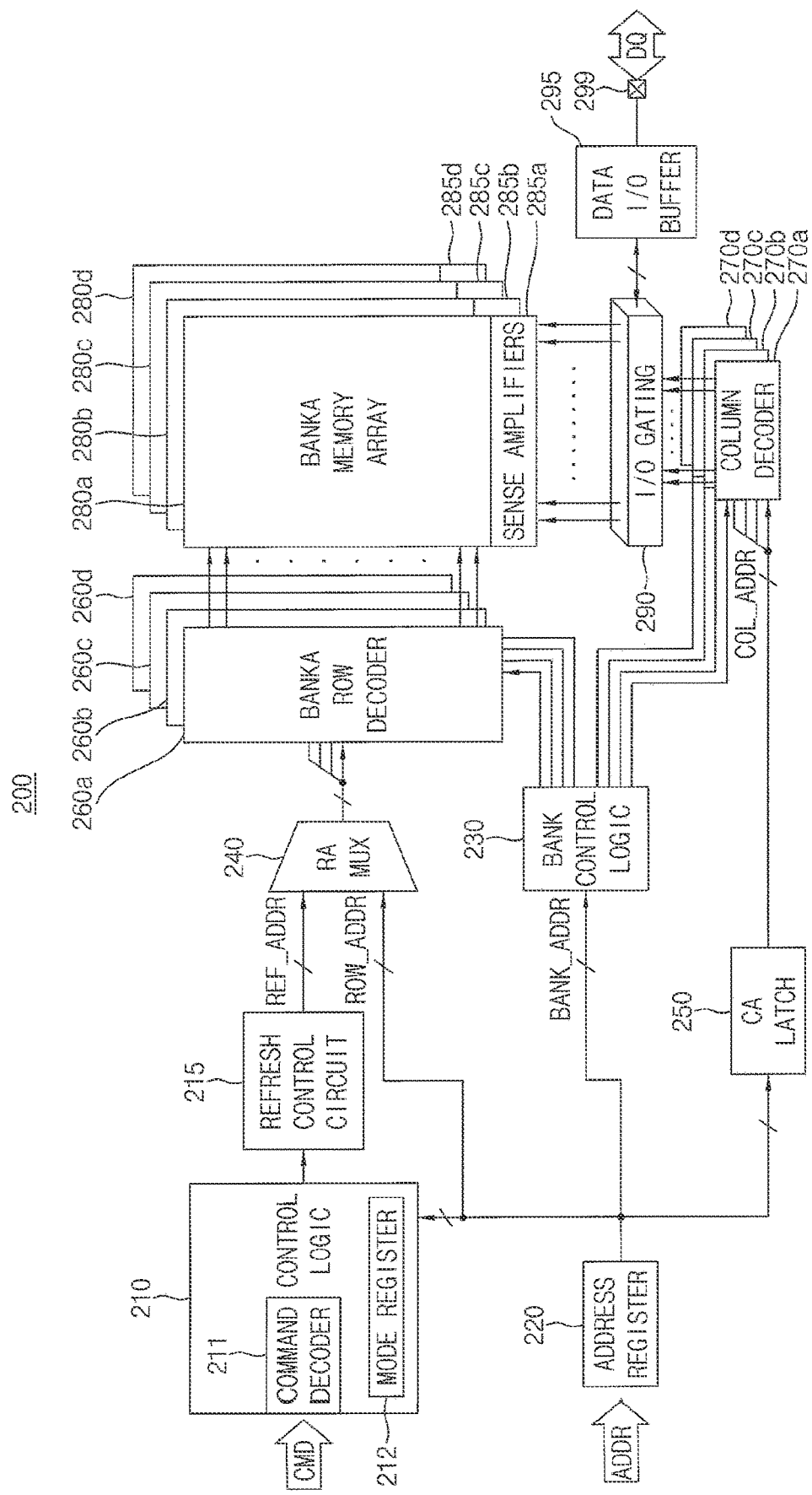
FIGS. 23A and 23B are block diagrams illustrating examples of a memory device included in a memory system according to an example embodiment.
Figure 23B:
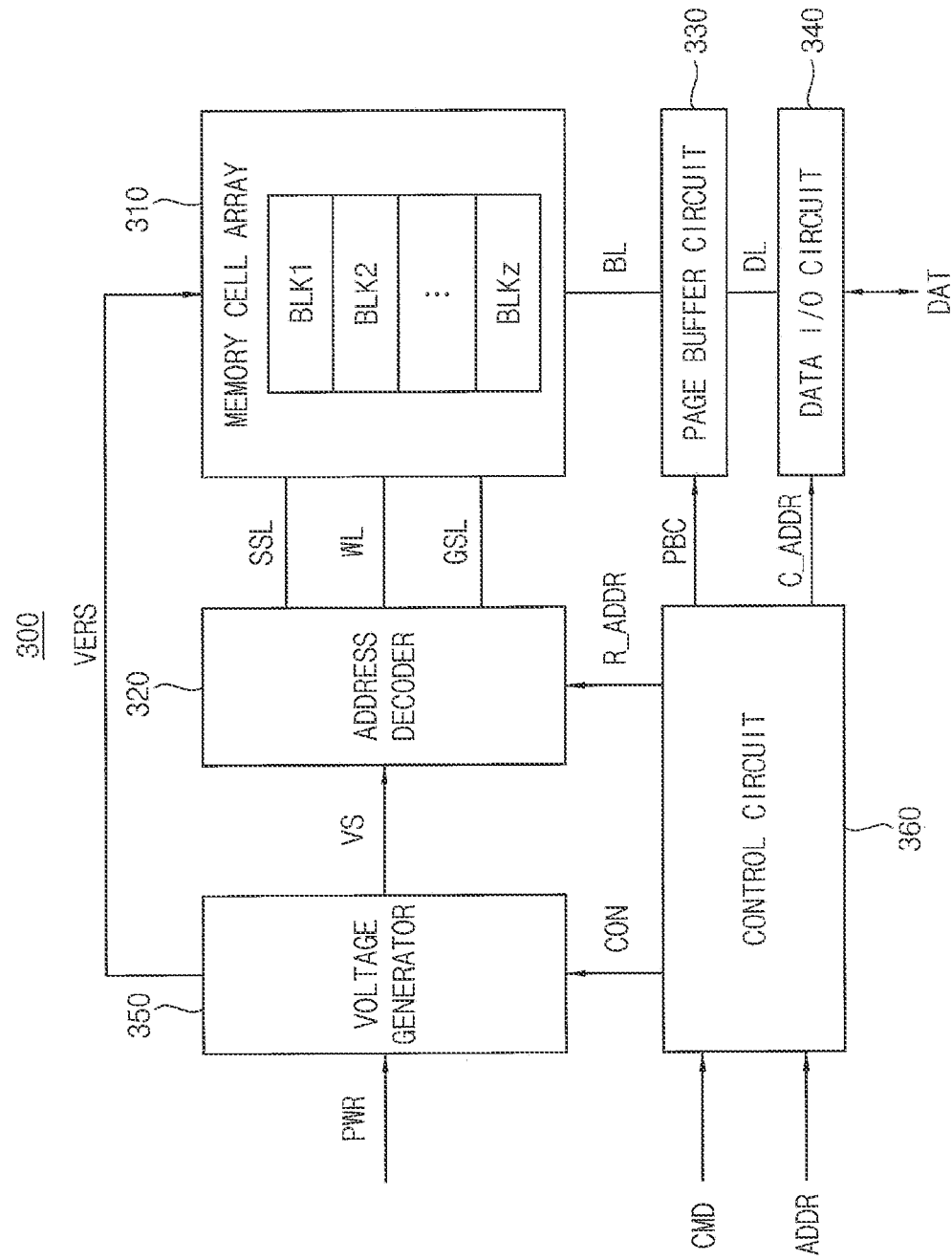

FIGS. 23A and 23B are block diagrams illustrating examples of a memory device included in a memory system according to example embodiments.

Referring to FIG. 23A, a memory device 200 includes a control logic 210, a refresh control circuit 215, an address register 220, a bank control logic 230, a row address multiplexer 240, a column address latch 250, a row decoder, a column decoder, a memory cell array, a sense amplifier unit, an input/output (I/O) gating circuit 290, a data I/O buffer 295 and a data I/O pad 299. In some example embodiments, the memory device 200 may be, e.g., a volatile memory device. For example, the memory device 200 may be one of various volatile memory devices such as a dynamic random access memory (DRAM).

The memory cell array may include a plurality of memory cells. The memory cell array may include a plurality of bank arrays, e.g., first through fourth bank arrays 280a, 280b, 280c and 280d. The row decoder may include a plurality of bank row decoders, e.g., first through fourth bank row decoders 260a, 260b, 260c and 260d connected to the first through fourth bank arrays 280a, 280b, 280c and 280d, respectively. The column decoder may include a plurality of bank column decoders, e.g., first through fourth bank column decoders 270a, 270b, 270c and 270d connected to the first through fourth bank arrays 280a, 280b, 280c and 280d, respectively. The sense amplifier unit may include a plurality of bank sense amplifiers, e.g., first through fourth bank sense amplifiers 285a, 285b, 285c and 285d connected to the first through fourth bank arrays 280a, 280b, 280c and 280d, respectively.

The first through fourth bank arrays 280a to 280d, the first through fourth bank row decoders 260a to 260d, the first through fourth bank column decoders 270a to 270d, and the first through fourth bank sense amplifiers 285a to 285d may form first through fourth banks, respectively. For example, the first bank array 280a, the first bank row decoder 260a, the first bank column decoder 270a, and the first bank sense amplifier 285a may form the first bank; the second bank array 280b, the second bank row decoder 260b, the second bank column decoder 270b, and the second bank sense amplifier 285b may form the second bank; the third bank array 280c, the third bank row decoder 260c, the third bank column decoder 270c, and the third bank sense amplifier 285c may form the third bank; and the fourth bank array 280d, the fourth bank row decoder 260d, the fourth bank column decoder 270d, and the fourth bank sense amplifier 285d may form the fourth bank.

The address register 220 may receive an address ADDR including a bank address BANK_ADDR, a row address ROW_ADDR and a column address COL_ADDR from a memory controller (e.g., the memory controller 20 in FIG. 20). The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to receipt of the bank address BANK_ADDR. One of the first through fourth bank row decoders 260a to 260d corresponding to the received bank address BANK_ADDR may be activated in response to the bank control signals generated by the bank control logic 230, and one of the first through fourth bank column decoders 270a to 270d corresponding to the received bank address BANK_ADDR may be activated in response to the bank control signals generated by the bank control logic 230.

The refresh control circuit 215 may generate a refresh address REF_ADDR in response to receipt of a refresh command or entrance of any self refresh mode. For example, the refresh control circuit 215 may include a refresh counter that is configured to sequentially change the refresh address REF_ADDR from a first address of the memory cell array to a last address of the memory cell array. The refresh control circuit 215 may receive control signals from the control logic 210.

The row address multiplexer 240 may receive the row address ROW_ADDR from the address register 220, and may receive the refresh address REF_ADDR from the refresh control circuit 215. The row address multiplexer 240 may selectively output the row address ROW_ADDR or the refresh address REF_ADDR. A row address output from the row address multiplexer 240 (e.g., the row address ROW_ADDR or the refresh address REF_ADDR) may be applied to the first through fourth bank row decoders 260a to 260d.

The activated one of the first through fourth bank row decoders 260a to 260d may decode the row address output from the row address multiplexer 240, and may activate a wordline corresponding to the row address. For example, the activated bank row decoder may apply a wordline driving voltage to the wordline corresponding to the row address.

The column address latch 250 may receive the column address COL_ADDR from the address register 220, and may temporarily store the received column address COL_ADDR. The column address latch 250 may apply the temporarily stored or received column address COL_ADDR to the first through fourth bank column decoders 270a to 270d.

The activated one of the first through fourth bank column decoders 270a to 270d may decode the column address COL_ADDR output from the column address latch 250, and may control the I/O gating circuit 290 to output data corresponding to the column address COL_ADDR.

The I/O gating circuit 290 may include a circuitry for gating I/O data. For example, although not shown, the I/O gating circuit 290 may include an input data mask logic, read data latches for storing data output from the first through fourth bank arrays 280a to 280d, and write drivers for writing data to the first through fourth bank arrays 280a to 280d.

Data DQ to be read from one of the first through fourth bank arrays 280a to 280d may be sensed by a sense amplifier coupled to the one bank array, and may be stored in the read data latches. The data DQ stored in the read data latches may be provided to the memory controller via the data I/O buffer 295 and the data I/O pad 299. Data DQ received via the data I/O pad 299 that are to be written to one of the first through fourth bank arrays 280a to 280d may be provided from the memory controller to the data I/O buffer 295. The data DQ received via the data I/O pad 299 and provided to the data I/O buffer 295 may be written to the one bank array via the write drivers in the I/O gating circuit 290. Although not illustrated in FIG. 23A, a transmitter (e.g., the transmitter 45a in FIG. 21A) that generates the multi-level signal and a receiver (e.g., the receiver 47a in FIG. 21A) that receives the multi-level signal according to example embodiments may be included in the data I/O buffer 295.

The control logic 210 may control an operation of the memory device 200. For example, the control logic 210 may generate control signals for the memory device 200 to perform a data write operation or a data read operation. The control logic 210 may include a command decoder 211 that decodes a command CMD received from the memory controller and a mode register 212 that sets an operation mode of the memory device 200.

Referring to FIG. 23B, a memory device 300 may include a memory cell array 310, an address decoder 320, a page buffer circuit 330, a data input/output (I/O) circuit 340, a voltage generator 350 and a control circuit 360. For example, the memory device 300 may be one of various nonvolatile memory devices such as a NAND flash memory device.

The memory cell array 310 is connected to the address decoder 320 via a plurality of string selection lines SSL, a plurality of wordlines WL and a plurality of ground selection lines GSL. The memory cell array 310 is further connected to the page buffer circuit 330 via a plurality of bitlines BL. The memory cell array 310 may include a plurality of memory cells (e.g., a plurality of nonvolatile memory cells) that are connected to the plurality of wordlines WL and the plurality of bitlines BL. The memory cell array 310 may be divided into a plurality of memory blocks BLK1, BLK2, . . . , BLKz each of which includes memory cells.

In some example embodiments, the plurality of memory cells may be arranged in a two dimensional (2D) array structure or a three dimensional (3D) vertical array structure. A three-dimensional vertical array structure may include vertical cell strings that are vertically oriented such that at least one memory cell is located over another memory cell. The at least one memory cell may comprise a charge trap layer. The following patent documents, which are hereby incorporated by reference in their entirety, describe suitable configurations for a memory cell array including a 3D vertical array structure, in which the three-dimensional memory array is configured as a plurality of levels, with wordlines and/or bitlines shared between levels: U.S. Pat. Nos. 7,679,133; 8,553,466; 8,654,587; 8,559,235; and US Pat. Pub. No. 2011/0233648.

The control circuit 360 receives a command CMD and an address ADDR from the outside (e.g., from the memory controller 20 in FIG. 20), and control erasure, programming and read operations of the memory device 300 based on the command CMD and the address ADDR. An erasure operation may include performing a sequence of erase loops, and a program operation may include performing a sequence of program loops. Each program loop may include a program operation and a program verification operation. Each erase loop may include an erase operation and an erase verification operation. The read operation may include a normal read operation and data recovery read operation.

For example, the control circuit 360 may generate control signals CON, which are used for controlling the voltage generator 350, and may generate control signal PBC for controlling the page buffer circuit 330, based on the command CMD, and may generate a row address R_ADDR and a column address C_ADDR based on the address ADDR. The control circuit 360 may provide the row address R_ADDR to the address decoder 320 and may provide the column address C_ADDR to the data I/O circuit 340.

The address decoder 320 may be connected to the memory cell array 310 via the plurality of string selection lines SSL, the plurality of wordlines WL and the plurality of ground selection lines GSL. For example, in the data erase/write/read operations, the address decoder 320 may determine at least one of the plurality of wordlines WL as a selected wordline, at least one of the plurality of string selection lines SSL as a selected string selection line, and at least one of the plurality of ground selection lines GSL as a selected ground selection line, based on the row address R_ADDR.

The voltage generator 350 may generate voltages VS that are required for an operation of the memory device 300 based on a power PWR and the control signals CON. The voltages VS may be applied to the plurality of string selection lines SSL, the plurality of wordlines WL and the plurality of ground selection lines GSL via the address decoder 320. In addition, the voltage generator 350 may generate an erase voltage VERS that is required for the data erase operation based on the power PWR and the control signals CON.

The page buffer circuit 330 may be connected to the memory cell array 310 via the plurality of bitlines BL. The page buffer circuit 330 may include a plurality of page buffers. The page buffer circuit 330 may store data DAT to be programmed into the memory cell array 310 or may read data DAT sensed from the memory cell array 310. In other words, the page buffer circuit 330 may operate as a write driver or a sensing amplifier according to an operation mode of the memory device 300.

The data I/O circuit 340 may be connected to the page buffer circuit 330 via data lines DL. The data I/O circuit 340 may provide the data DAT from the outside of the memory device 300 to the memory cell array 310 via the page buffer circuit 330 or may provide the data DAT from the memory cell array 310 to the outside of the memory device 300, based on the column address C_ADDR. Although not illustrated in FIG. 23B, a transmitter (e.g., the transmitter 45a in FIG. 21A) that generates the multi-level signal and a receiver (e.g., the receiver 47a in FIG. 21A) that receives the multi-level signal according to example embodiments may be included in the data I/O circuit 340.

Although the memory device included in the memory system according to example embodiments is described based on a DRAM and a NAND flash memory, the memory device according to example embodiments may be any volatile memory device, and/or any nonvolatile memory device, e.g., a static random access memory (SRAM), a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), or the like.

Figure 24:
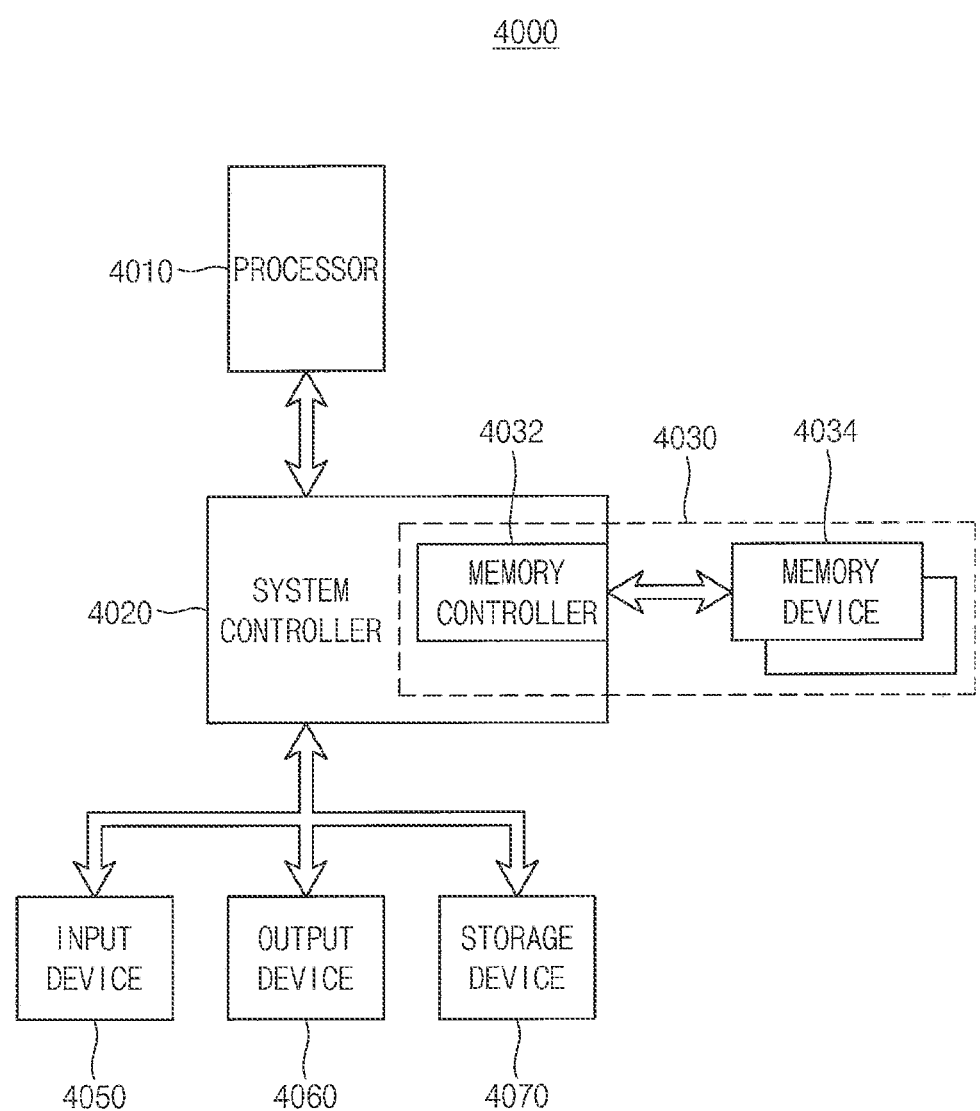
FIG. 24 is a block diagram illustrating a computing system according to an example embodiment.

FIG. 24 is a block diagram illustrating a computing system according to an example embodiment.

Referring to FIG. 24, a computing system 4000 includes a processor 4010, a system controller 4020 and a memory system 4030. The computing system 4000 may further include an input device 4050, an output device 4060 and a storage device 4070.

The memory system 4030 includes a plurality of memory devices 4034, and a memory controller 4032 for controlling the memory devices 4034. The memory controller 4032 may be included in the system controller 4020. The memory system 4030 may be the memory system according to example embodiments, and may include the receiver according to example embodiments.

The processor 4010 may perform various computing functions, such as executing specific software instructions for performing specific calculations or tasks. The processor 4010 may be connected to the system controller 4020 via a processor bus. The system controller 4020 may be connected to the input device 4050, the output device 4060 and the storage device 4070 via an expansion bus. As such, the processor 4010 may control the input device 4050, the output device 4060 and the storage device 4070 using the system controller 4020.

Figure 25:
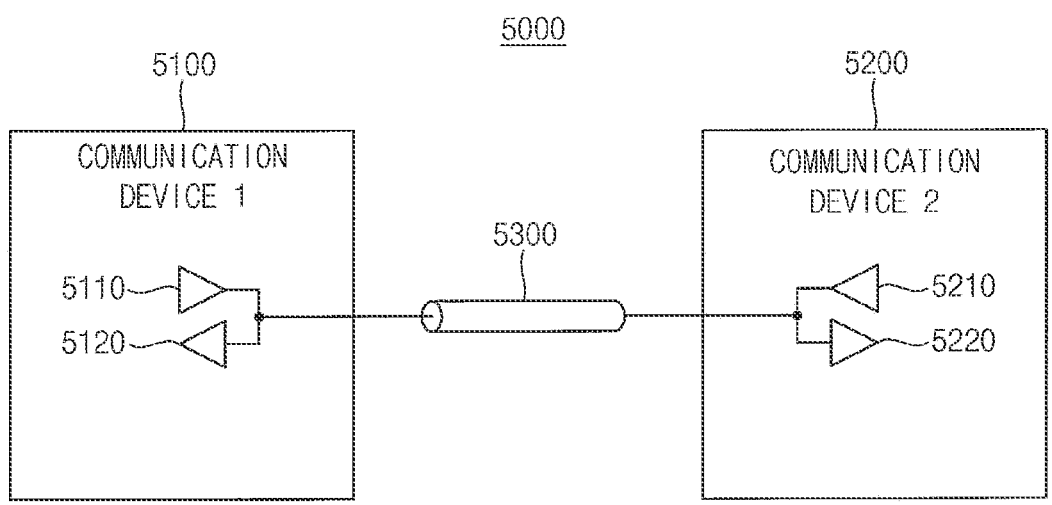
FIG. 25 is a block diagram illustrating a communication system according to an example embodiment.

FIG. 25 is a block diagram illustrating a communication system according to an example embodiment.

Referring to FIG. 25, a communication system 5000 includes a first communication device 5100, a second communication device 5200 and a channel 5300.

The first communication device 5100 includes a first transmitter 5110 and a first receiver 5120. The second communication device 5200 includes a second transmitter 5210 and a second receiver 5220. The first transmitter 5110 and the first receiver 5120 are connected to the second transmitter 5210 and the second receiver 5220 through the channel 5300. The receivers 5120 and 5220 may be the receiver according to example embodiments. In some example embodiments, each of the first and second communication devices 5100 and 5200 may include a plurality of transmitters and a plurality of receivers, and the communication system 5000 may include a plurality of channels for connecting the plurality of transmitters and a plurality of receivers.

The inventive concept may be applied to various electronic devices and systems that include the memory devices and the memory systems. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims.

What is claimed is:

1. A receiver configured to receive a multi-level signal having three or more voltage levels that are different from each other, comprising:
a pre-amplifier circuit configured to generate a plurality of intermediate data signals based on an input data signal that is the multi-level signal and a plurality of reference voltages;
a slicer circuit configured to generate a plurality of decision signals based on the plurality of intermediate data signals and a clock signal; and
a decoder circuit configured to generate output data based on the plurality of decision signals, the output data including two or more bits, and
wherein the pre-amplifier circuit comprises:
a first circuit configured to generate one of the plurality of intermediate data signals based on the input data signal and one of the plurality of reference voltages, the first circuit having a first structure; and
a second circuit configured to generate another one of the plurality of intermediate data signals based on the input data signal and another one of the plurality of reference voltages, the second circuit having a second structure different from the first structure.

2. The receiver of claim 1, wherein:
the first circuit includes a plurality of first transistors,
the second circuit includes a plurality of second transistors, and
a number of the plurality of first transistors is different from a number of the plurality of second transistors, or a type of at least one of the plurality of first transistors is different from a type of at least one of the plurality of second transistors, or a connection structure of at least one of the plurality of first transistors is different from a connection structure of at least one of the plurality of second transistors.

3. The receiver of claim 2, wherein:
the first circuit is configured to generate a first intermediate data signal based on the input data signal having a first voltage level and a first reference voltage among the plurality of reference voltages,
the second circuit is configured to generate a second intermediate data signal based on the input data signal having the first voltage level and the first reference voltage among the plurality of reference voltages, and
a voltage level of the first intermediate data signal generated based on the input data signal having the first voltage level and the first reference voltage is different from a voltage level of the second intermediate data signal generated based on the input data signal having the first voltage level and the first reference voltage.

4. The receiver of claim 2, wherein:
the first circuit is configured to generate a first driving current based on the input data signal having a first voltage level and a first reference voltage among the plurality of reference voltages,
the second circuit is configured to generate a second driving current based on the input data signal having the first voltage level and the first reference voltage among the plurality of reference voltages, and
an amount of the first driving current generated based on the input data signal having the first voltage level and the first reference voltage is different from an amount of the second driving current generated based on the input data signal having the first voltage level and the first reference voltage.

5. The receiver of claim 1, wherein:
the three or more voltage levels include a first voltage level, a second voltage level, a third voltage level and a fourth voltage level that are different from each other,
the plurality of reference voltages include a first reference voltage, a second reference voltage and a third reference voltage that are different from each other, and
the two or more bits include a first bit and a second bit that are distinct from each other.

6. The receiver of claim 5, wherein the pre-amplifier circuit comprises:
a first level shifter configured to generate a first intermediate data signal by level-shifting the input data signal based on the first reference voltage;
a second level shifter configured to generate a second intermediate data signal by level-shifting the input data signal based on the second reference voltage; and
a third level shifter configured to generate a third intermediate data signal by level-shifting the input data signal based on the third reference voltage.

7. The receiver of claim 6, wherein each of the first, second and third level shifters comprises:
a plurality of first input transistors connected between a first output node outputting a respective one of the first, second and third intermediate data signals and a ground voltage, each of the first input transistors including a gate electrode receiving the input data signal;
a plurality of second input transistors connected between a second output node and the ground voltage, each of the second input transistors including a gate electrode receiving a respective one of the first, second and third reference voltages;
a first output transistor connected between a power supply voltage and the first output node, the first output transistor including a gate electrode; and
a second output transistor connected between the power supply voltage and the second output node, the second output transistor including a gate electrode connected to the gate electrode of the first output transistor.

8. The receiver of claim 7, wherein:
the first level shifter has the first structure, and
each of the second and third level shifters has the second structure.

9. The receiver of claim 8, wherein a number of the first and second input transistors included in the first level shifter is greater than a number of the first and second input transistors included in the second level shifter.

10. The receiver of claim 8, wherein a threshold voltage of the first and second input transistors included in the first level shifter is lower than a threshold voltage of the first and second input transistors included in the second level shifter.

11. The receiver of claim 8, wherein a body bias voltage of the first and second input transistors included in the first level shifter is lower than a body bias voltage of the first and second input transistors included in the second level shifter.

12. The receiver of claim 7, wherein:
the third level shifter has the first structure, and
each of the first and second level shifters has the second structure.

13. The receiver of claim 12, wherein a number of the first and second input transistors included in the third level shifter is less than a number of the first and second input transistors included in the second level shifter.

14. The receiver of claim 12, wherein a threshold voltage of the first and second input transistors included in the third level shifter is higher than a threshold voltage of the first and second input transistors included in the second level shifter.

15. The receiver of claim 5, wherein the pre-amplifier circuit comprises:
a first continuous time linear equalizer (CTLE) configured to generate a first intermediate data signal by equalizing the input data signal based on the first reference voltage;
a second continuous time linear equalizer configured to generate a second intermediate data signal by equalizing the input data signal based on the second reference voltage; and
a third continuous time linear equalizer configured to generate a third intermediate data signal by equalizing the input data signal based on the third reference voltage.

16. The receiver of claim 15, wherein each of the first, second and third continuous time linear equalizers comprises:
a first sub circuit configured to receive the input data signal and one of the first, second and third reference voltages, and to output one of the first, second and third intermediate data signals;
a second sub circuit connected to the first sub circuit, and configured to supply a driving current for generating one of the first, second and third intermediate data signals; and
a third sub circuit connected to the second sub circuit, and configured to generate a bias current for generating the driving current.

17. The receiver of claim 16, wherein:
the first continuous time linear equalizer has the first structure, and
each of the second and third continuous time linear equalizers has the second structure.

18. The receiver of claim 17, wherein a number of transistors included in the second sub circuit of the first continuous time linear equalizer is less than a number of transistors included in the second sub circuit of the second continuous time linear equalizer.

19. A memory device comprising:
a receiver configured to receive an input data signal that is a multi-level signal having three or more voltage levels that are different from each other; and
a memory cell array configured to perform a data write operation based on the input data signal,
wherein the receiver comprises:
a pre-amplifier circuit configured to generate a plurality of intermediate data signals based on the input data signal and a plurality of reference voltages;
a slicer circuit configured to generate a plurality of decision signals based on the plurality of intermediate data signals and a clock signal; and
a decoder circuit configured to generate output data based on the plurality of decision signals, the output data including two or more bits, and
wherein the pre-amplifier circuit comprises:
a first circuit configured to generate one of the plurality of intermediate data signals based on the input data signal and one of the plurality of reference voltages, the first circuit having a first structure; and
a second circuit configured to generate another one of the plurality of intermediate data signals based on the input data signal and another one of the plurality of reference voltages, the second circuit having a second structure different from the first structure.

20. A receiver configured to receive a multi-level signal having a first voltage level, a second voltage level, a third voltage level and a fourth voltage level that are different from each other, comprising:
a pre-amplifier circuit configured to generate a first intermediate data signal, a second intermediate data signal and a third intermediate data signal based on an input data signal, a first reference voltage, a second reference voltage and a third reference voltage, the input data signal being the multi-level signal, the first reference voltage having a voltage level between the first and second voltage levels, the second reference voltage having a voltage level between the second and third voltage levels, the third reference voltage having a voltage level between the third and fourth voltage levels;

a slicer circuit configured to generate a first decision signal, a second decision signal and a third decision signal based on the first, second and third intermediate data signals and a clock signal; and a decoder circuit configured to generate output data based on the first, second and third decision signals, the output data including a first bit and a second bit, wherein the pre-amplifier circuit includes:

a first level shifter configured to generate the first intermediate data signal by level-shifting the input data signal based on the first reference voltage;

a second level shifter configured to generate the second intermediate data signal by level-shifting the input data signal based on the second reference voltage; and a third level shifter configured to generate the third intermediate data signal by level-shifting the input data signal based on the third reference voltage, wherein one of the first, second and third level shifters has a structure different from the remaining first, second and third level shifters, or all of the first, second and third level shifters have different structures, and wherein the structures of the first, second and third level shifters are determined based on a number, a type, or a connection structure of transistors included in the first, second and third level shifters.

* * * * *